(12) United States Patent
Lai et al.

(10) Patent No.: US 12,740,083 B2
(45) Date of Patent: Sep. 15, 2026

(54) METHOD OF GAP FILLING FOR SEMICONDUCTOR DEVICE

(71) Applicant: Taiwan Semiconductor Manufacturing Co., Ltd., Hsinchu (TW)

(72) Inventors: Te-Yang Lai, Hsinchu (TW); Che-Hao Chang, Hsinchu (TW); Chi On Chui, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 79 days.

(21) Appl. No.: 18/785,474

(22) Filed: Jul. 26, 2024

(65) Prior Publication Data

US 2024/0387704 A1 Nov. 21, 2024

Related U.S. Application Data

(62) Division of application No. 18/447,618, filed on Aug. 10, 2023, which is a division of application No. (Continued)

(51) Int. Cl.

*H01L 29/66* (2006.01)
*H10D 30/01* (2025.01)
(Continued)

(52) U.S. Cl.

CPC ....... *H10D 30/0243* (2025.01); *H10D 62/116* (2025.01); *H10D 62/292* (2025.01); (Continued)

(58) Field of Classification Search

CPC ............ H10D 30/0243; H10D 62/116; H10D 64/017; H10D 84/853; H10D 84/038; H10D 62/292
(Continued)

(56) References Cited

U.S. PATENT DOCUMENTS

| | | | |
|---|---|---|---|
| 8,836,016 | B2 | 9/2014 | Wu et al. |
| 8,841,701 | B2 | 9/2014 | Lin et al. |

(Continued)

FOREIGN PATENT DOCUMENTS

| | | | |
|---|---|---|---|
| CN | 111211088 | A | 5/2020 |
| KR | 20110104432 | A | 9/2011 |

(Continued)

*Primary Examiner* — Dzung Tran
(74) *Attorney, Agent, or Firm* — Slater Matsil, LLP

(57) ABSTRACT

A method of manufacturing a semiconductor device includes forming a dielectric layer conformally over a plurality of fins on a substrate, forming a first high-k layer conformally over the dielectric layer, and forming a flowable oxide over the first high-k layer. Forming the flowable oxide includes filling first trenches adjacent fins of the plurality of fins. The method further includes recessing the flowable oxide to form second trenches between adjacent fins of the plurality of fins, forming a second high-k layer over the first high-k layer and the flowable oxide, performing a planarization that exposes top surfaces of the plurality of fins, and recessing the dielectric layer to form a plurality of dummy fins that include remaining portions of the first and second high-k layers and the flowable oxide.

20 Claims, 24 Drawing Sheets

Related U.S. Application Data

17/226,755, filed on Apr. 9, 2021, now Pat. No. 11,824,104, which is a division of application No. 16/545,386, filed on Aug. 20, 2019, now Pat. No. 10,985,266.

(51) Int. Cl.

| | |
|---|---|
| ***H10D 62/10*** | (2025.01) |
| ***H10D 62/17*** | (2025.01) |
| ***H10D 64/01*** | (2025.01) |
| ***H10D 84/01*** | (2025.01) |
| ***H10D 84/03*** | (2025.01) |
| ***H10D 84/85*** | (2025.01) |
| ***H10P 14/60*** | (2026.01) |
| ***H10P 14/692*** | (2026.01) |
| ***H10P 50/28*** | (2026.01) |
| ***H10P 95/00*** | (2026.01) |
| ***H10W 10/00*** | (2026.01) |
| ***H10W 10/17*** | (2026.01) |

(52) U.S. Cl.

CPC ....... *H10D 64/017* (2025.01); *H10D 84/0188* (2025.01); *H10D 84/0193* (2025.01); *H10D 84/038* (2025.01); *H10D 84/853* (2025.01); *H10P 14/6334* (2026.01); *H10P 14/69392* (2026.01); *H10P 50/283* (2026.01); *H10P 95/062* (2026.01); *H10W 10/014* (2026.01); *H10W 10/17* (2026.01)

(58) Field of Classification Search

USPC .......................................................... 257/369

See application file for complete search history.

(56) References Cited

U.S. PATENT DOCUMENTS

| | | | | |
|---|---|---|---|---|
| 8,847,293 | B2 | 9/2014 | Lee et al. | |
| 8,853,025 | B2 | 10/2014 | Zhang et al. | |
| 8,962,400 | B2 | 2/2015 | Tsai et al. | |
| 9,093,514 | B2 | 7/2015 | Tsai et al. | |
| 9,236,267 | B2 | 1/2016 | De et al. | |
| 9,245,805 | B2 | 1/2016 | Yeh et al. | |
| 9,418,897 | B1 | 8/2016 | Ching et al. | |
| 9,520,482 | B1 | 12/2016 | Chang et al. | |
| 9,576,814 | B2 | 2/2017 | Wu et al. | |
| 9,608,116 | B2 | 3/2017 | Ching et al. | |
| 9,754,798 | B1 | 9/2017 | Bi et al. | |
| 9,812,363 | B1 | 11/2017 | Liao et al. | |
| 9,859,380 | B2 | 1/2018 | Lee et al. | |
| 10,236,220 | B1 | 3/2019 | Chang et al. | |
| 2008/0296650 | A1 | 12/2008 | Ahn et al. | |
| 2010/0072553 | A1 | 3/2010 | Xu et al. | |
| 2011/0068407 | A1* | 3/2011 | Yeh | H10D 84/038 257/369 |
| 2011/0230057 | A1 | 9/2011 | Takasawa et al. | |
| 2014/0145247 | A1 | 5/2014 | Cheng et al. | |
| 2015/0232986 | A1 | 8/2015 | Kameda et al. | |
| 2016/0043225 | A1 | 2/2016 | Ching et al. | |
| 2016/0155668 | A1 | 6/2016 | Yeh | |
| 2016/0197005 | A1* | 7/2016 | Tsao | H10D 30/024 438/424 |
| 2016/0268392 | A1 | 9/2016 | Zhu | |
| 2016/0336237 | A1 | 11/2016 | Lee et al. | |
| 2017/0125305 | A1 | 5/2017 | Zhou | |
| 2017/0133487 | A1 | 5/2017 | Chiang et al. | |
| 2017/0338225 | A1 | 11/2017 | Ching et al. | |
| 2018/0040703 | A1* | 2/2018 | Chang | H10D 62/10 |
| 2018/0061717 | A1 | 3/2018 | Wang et al. | |
| 2018/0166352 | A1 | 6/2018 | Choi et al. | |
| 2019/0035786 | A1 | 1/2019 | Huang et al. | |
| 2019/0067417 | A1 | 2/2019 | Ching et al. | |
| 2019/0103304 | A1 | 4/2019 | Lin et al. | |
| 2019/0221717 | A1 | 7/2019 | Lim et al. | |
| 2019/0355823 | A1 | 11/2019 | Lin et al. | |
| 2020/0075342 | A1 | 3/2020 | Chen et al. | |
| 2020/0083222 | A1 | 3/2020 | Kim et al. | |
| 2020/0105583 | A1 | 4/2020 | Wang et al. | |

FOREIGN PATENT DOCUMENTS

| | | | |
|---|---|---|---|
| KR | 20150097413 | A | 8/2015 |
| KR | 20190024530 | A | 3/2019 |
| TW | 201715615 | A | 5/2017 |

* cited by examiner

METHOD OF GAP FILLING FOR SEMICONDUCTOR DEVICE

PRIORITY CLAIM AND CROSS-REFERENCE

This application is a divisional of U.S. patent application Ser. No. 18/447,618, filed on Aug. 10, 2023, which is a divisional of U.S. patent application Ser. No. 17/226,755, filed on Apr. 9, 2021, now U.S. Pat. No. 11,824,104 issued on Nov. 21, 2023, entitled "Method of Gap Filling for Semiconductor Device," which is a divisional of U.S. patent application Ser. No. 16/545,386, filed on Aug. 20, 2019, now U.S. Pat. No. 10,985,266 issued Apr. 20, 2021, entitled "Method of Gap Filling for Semiconductor Device," each application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
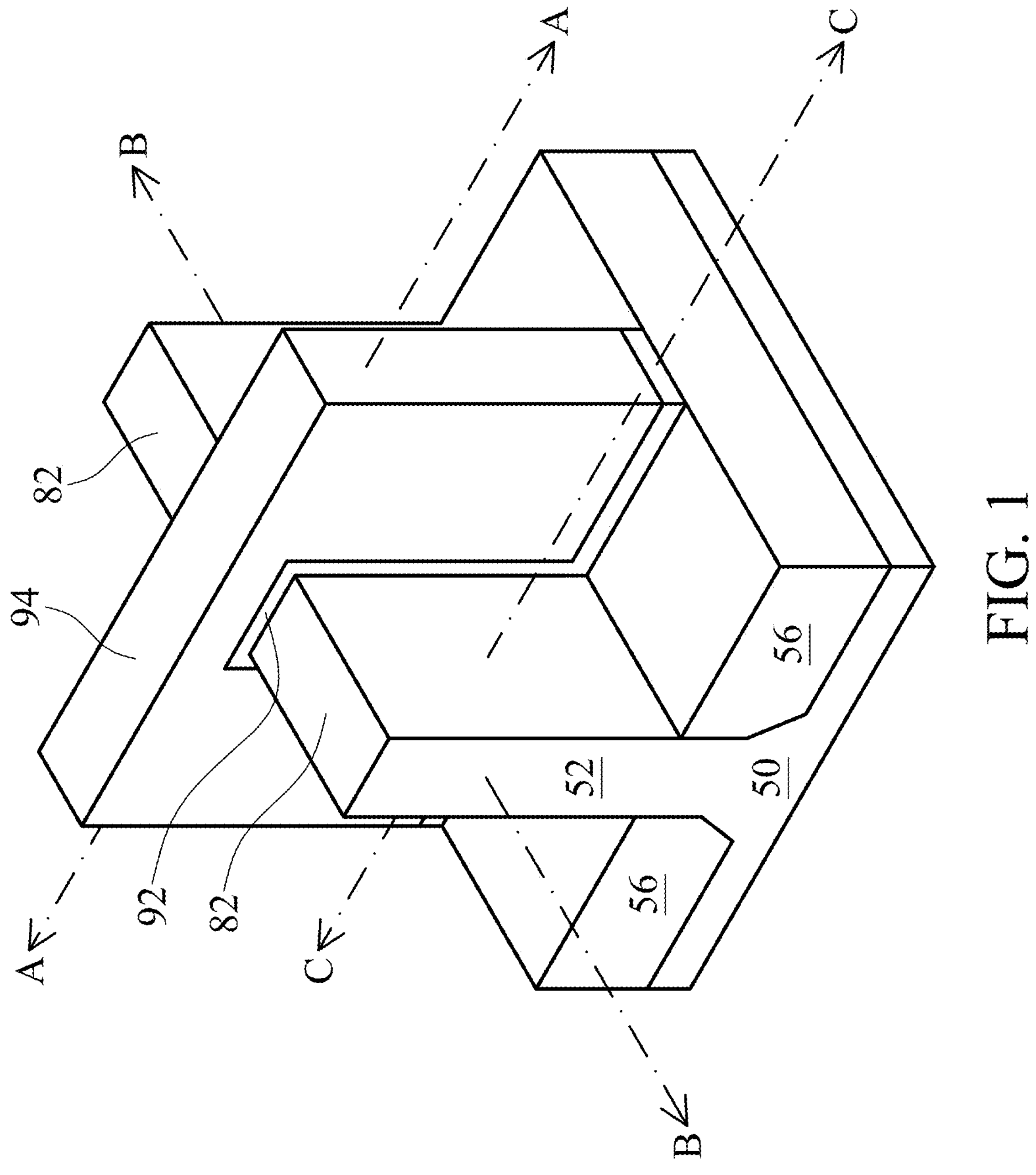
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Advantageous features of one or more embodiments disclosed herein include a method for gap filling between semiconductor fins by forming a high-k dummy fin with better shape profile control and less formation of seam and/or voids. This is done by introducing a bi-layer approach using an atomic layer deposition (ALD) of a high-k dielectric layer and a flowable oxide layer deposition. This bi-layer dummy fin formation procedure can overcome a potential fin to fin bending effect from the high-k layer.

High-k material is a good candidate for an etch selective gap fill material, in comparison with other candidates such as front end of the line (FEOL) SiOx, SiN, and SiON. This selective high-k dummy fin material is beneficial in current node processes. However, usage of a single ALD high-k film to fill gaps in a high aspect ratio fin to fin space may lead to serious fin to fin bending due to intermolecular chemical bond forces between regions of high-k material on adjacent semiconductor fins as the single ALD high-k film is used to fill the gaps between adjacent semiconductor fins. The high aspect ratio structure of the semiconductor fins with greater height of the fins, shorter fin width between adjacent fins, and smaller fin pitch (width of the semiconductor fins themselves) is believed to enhance the fin to fin bending effect. Permanent fin bending damage may result even if the single ALD high-k film is removed. Additionally, usage of the single ALD high-k film may result in serious seams and/or voids in the resulting high-k dummy fin induced by the semiconductor fin bending. Furthermore, the high-k value of the single ALD high-k film may also degrade AC performance and lead to RC delay.

Embodiments of the bilayer approach to forming a dummy fin disclosed herein allow for better shape profile control, less formation of seams and voids in the interior of the dummy fin, and avoidance of a fin to fin bending effect from intermolecular force between high-k regions on neighboring fins. The bilayer approach to forming the dummy fin also allows for lower k value in the dummy fin, preserving AC performance and reducing RC delay.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 22B are cross-sectional views of intermediate stages in the manufacturing of FinFETs, in accordance with some embodiments. FIGS. 2 through 13 illustrate reference cross-section A-A illustrated in FIG. 1, except for multiple fins/FinFETs. FIGS. 14A, 15A, 16A, 17A, 18A, 19A, 20A, 21A, and 22A are illustrated along reference cross-section A-A illustrated in FIG. 1, and FIGS. 14B, 15B, 16B, 17B, 18B, 19B, 20B, 20C, 21B, and 22B are illustrated along a similar cross-section B-B illustrated in FIG. 1, except for multiple fins/FinFETs. FIGS. 16C, 16D, 16E, and 16F are illustrated along reference cross-section C-C illustrated in FIG. 1, except for multiple fins/FinFETs.

Figure 2:
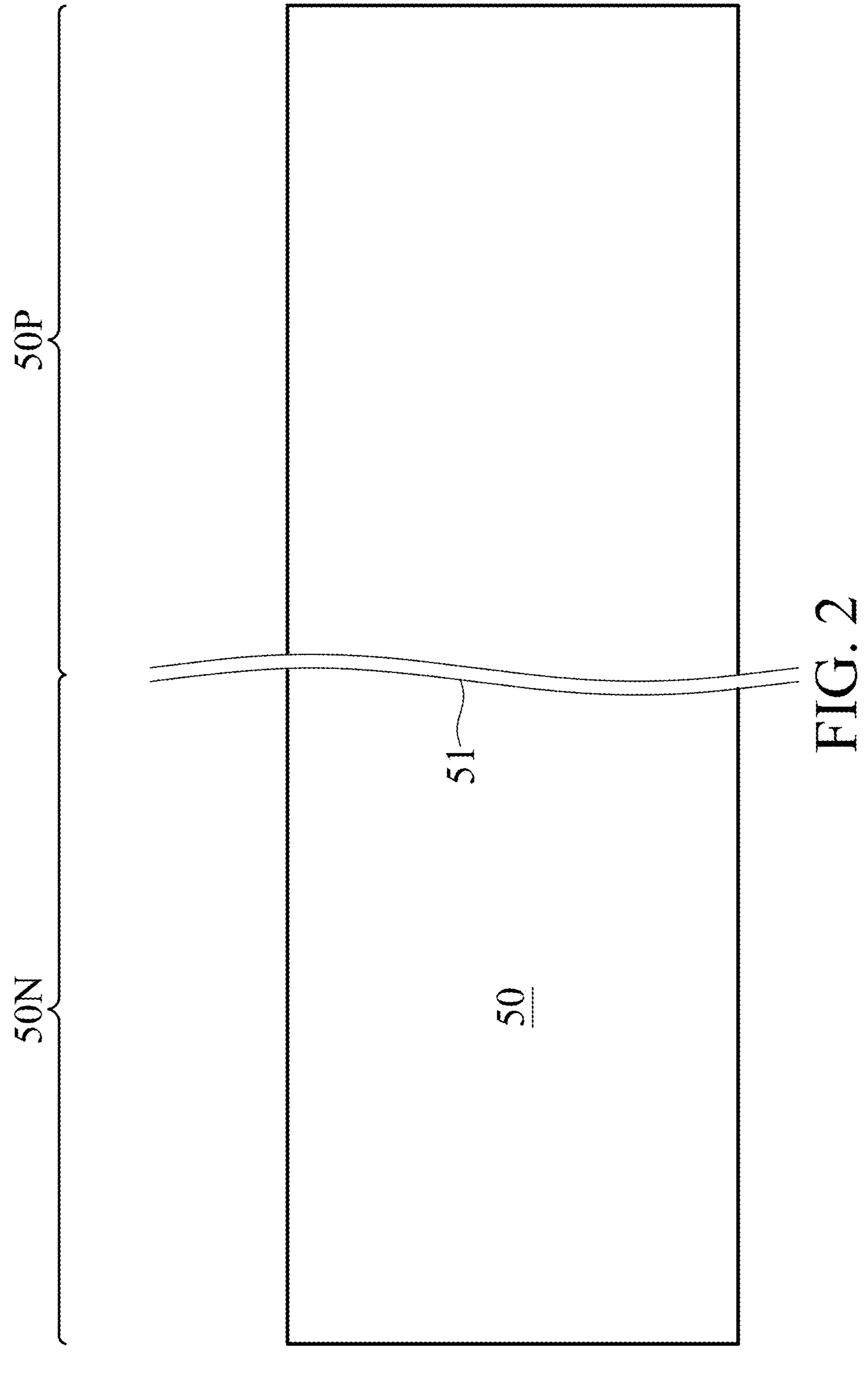
FIGS. 2, 3, 4, 5, 6, 7, 8, 9, 10, 11, 12, 13, 14A, 14B, 15A, 15B, 16A, 16B, 16C, 16D, 16E, 16F, 17A, 17B, 18A, 18B, 19A, 19B, 20A, 20B, 20C, 21A, 21B, 22A, and 22B are cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

Figure 3:
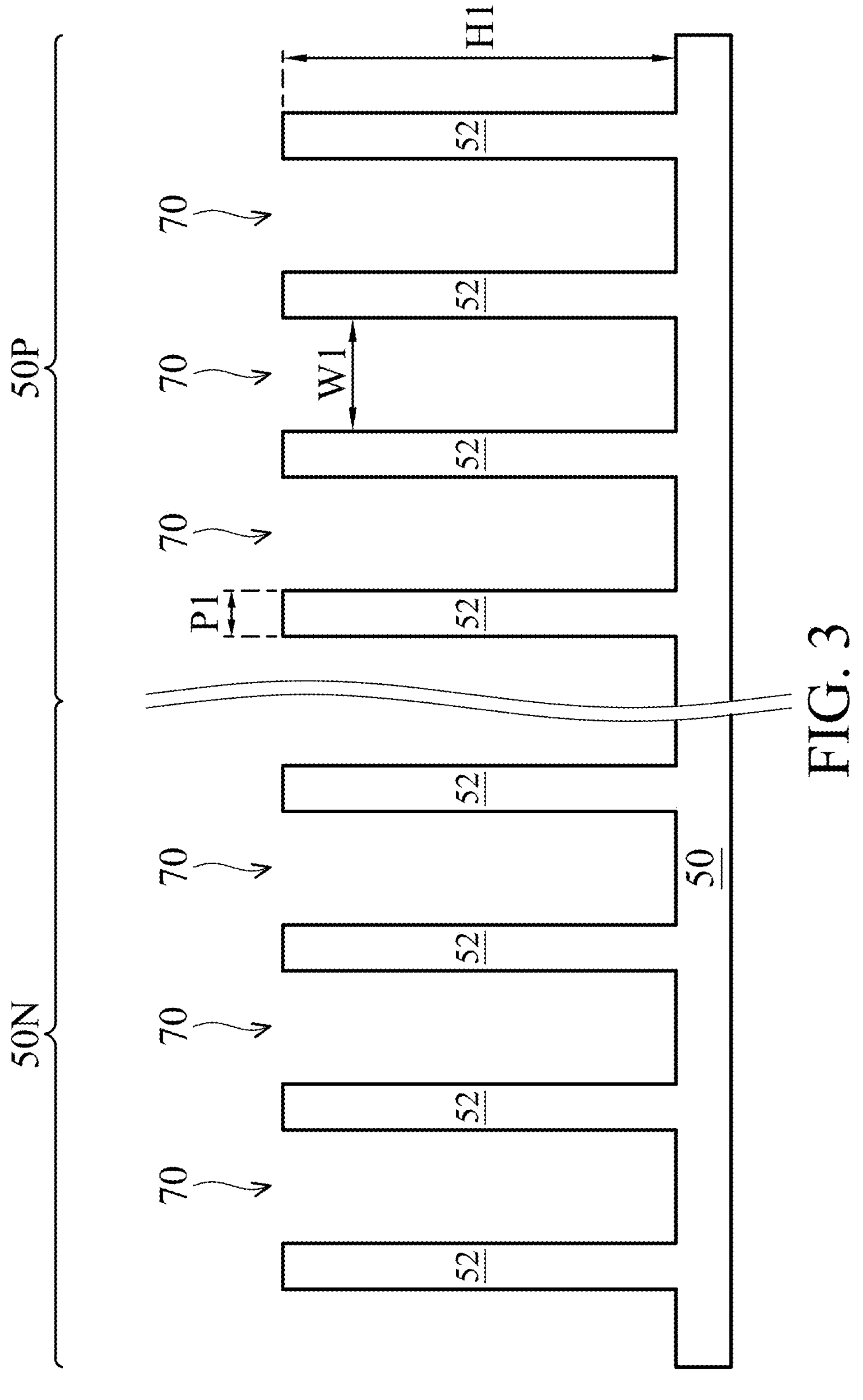

In FIG. 3, fins 52 are formed in the substrate 50. The fins 52 are semiconductor strips. The semiconductor material of fins 52 may include silicon; germanium; an alloy semiconductor including SiGe, GaAsP, AlInAs, AlGaAs, GaInAs, GaInP, and/or GaInAsP; a compound semiconductor including silicon carbide, gallium arsenic, gallium phosphide, indium phosphide, indium arsenide, and/or indium antimonide; or combinations thereof. In some embodiments, the fins 52 may be formed in the substrate 50 by etching trenches 70 in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

As illustrated in FIG. 3, a fin height H1 of the fins 52 may be between about 50 nm and about 250 nm, a fin width W1 between the fins 52 may be between about 3 nm and about 100 nm, and a fin pitch P1 of the fins 52 may be greater than about 5 nm. Ratios of the fin height H1 to the fin width W1 to the fin pitch P1 may be between about 5:1:1 to about 25:20:1. In an exemplary embodiment, the fin height H1 is between about 100 nm and about 200 nm, the fin width W1 is between about 5 nm and about 50 nm, and the fin pitch P1 is greater than about 10 nm.

Figure 4:
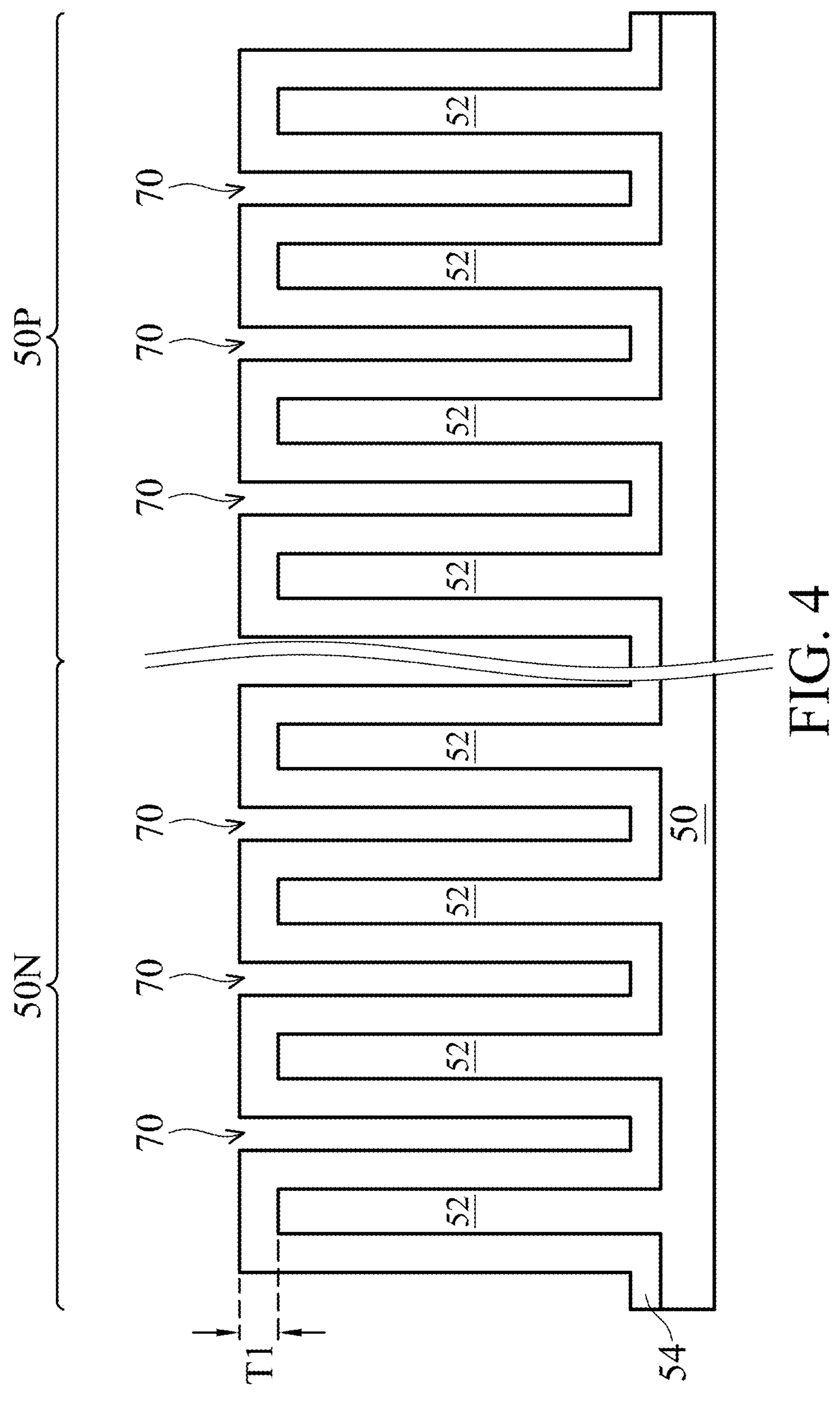

In FIG. 4, a dielectric layer 54 is formed over the fins 52. In some embodiments, the dielectric layer 54 is formed in order to define the width of dummy fins 160 to be formed later. The dielectric layer 54 is deposited along the top surfaces and the sidewalls of the fins 52 such that the trenches 70 are not wholly filled. The dielectric layer 54 may be formed with a thickness T1 between about 3 nm and about 20 nm. The ratio between the thickness T1 of the dielectric layer 54 and the fin pitch P1 of the fins 52 may be between about 1:6 to about 2:1. The dielectric layer 54 may be an oxide, such as silicon oxide, a nitride, the like, or a combination thereof, and may be deposited by an atomic layer deposition (ALD), PEALD, the like, or a combination thereof. Other insulation materials formed by any acceptable process may be used. In the illustrated embodiment, the dielectric layer 54 is silicon oxide or SiCON formed by an ALD process.

Figure 5:
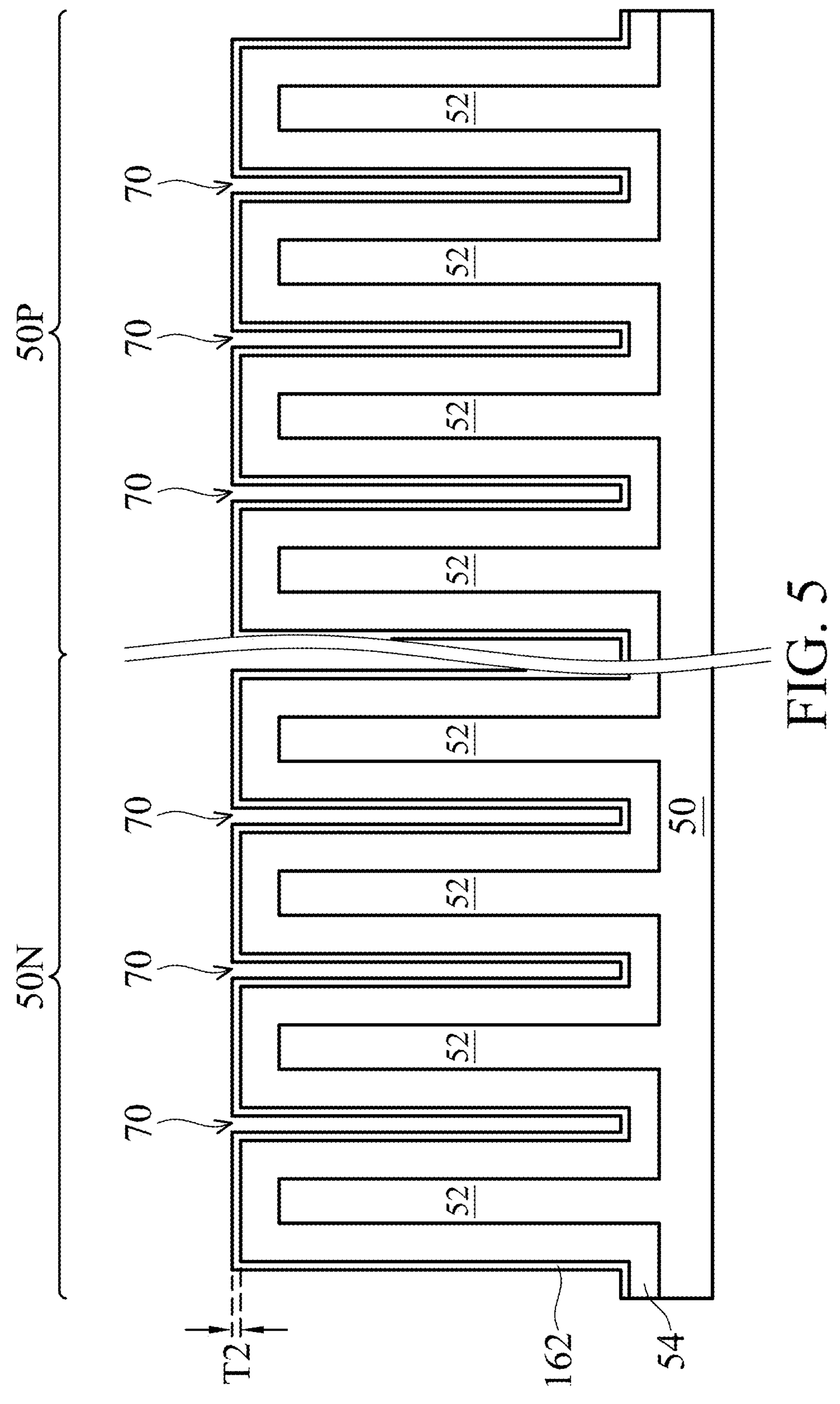

In FIG. 5, a high-k layer 162 is formed over the dielectric layer 54. The high-k layer 162 is formed in the trenches 70 between the fins 52 at a sufficient thinness to prevent merging of the high-k layer 162 on adjacent fins 52. While the precise mechanisms are not fully understood, it is believed that by avoiding this merging, fin bending of adjacent fins 52 towards each other by intermolecular forces between regions of the high-k material on adjacent fins 52 may be prevented. The high-k layer 162 may comprise $HfO_2$. In an embodiment, the high-k layer 162 comprises $HfO_2$ doped with Al, Zr, Si, and/or La. The high-k layer 162 may be formed by, for example, an atomic layer deposition (ALD) process or a pulsed laser deposition (PLD) process. The ALD process may be performed for a period of time between about 0.5 s and about 60 s at a temperature between about 200° C. and about 500° C. In an exemplary embodiment, the ALD process is performed for a period of about 10 s at a temperature between about 200° C. and about 500° C. As shown in FIG. 5, the high-k layer may be formed with a thickness T2 between about 1 nm and about 10 nm. The ratio between the thickness T2 of the high-k layer 162 and the thickness T1 of the dielectric layer 54 may be between about 1:20 to about 3:1.

Figure 6:
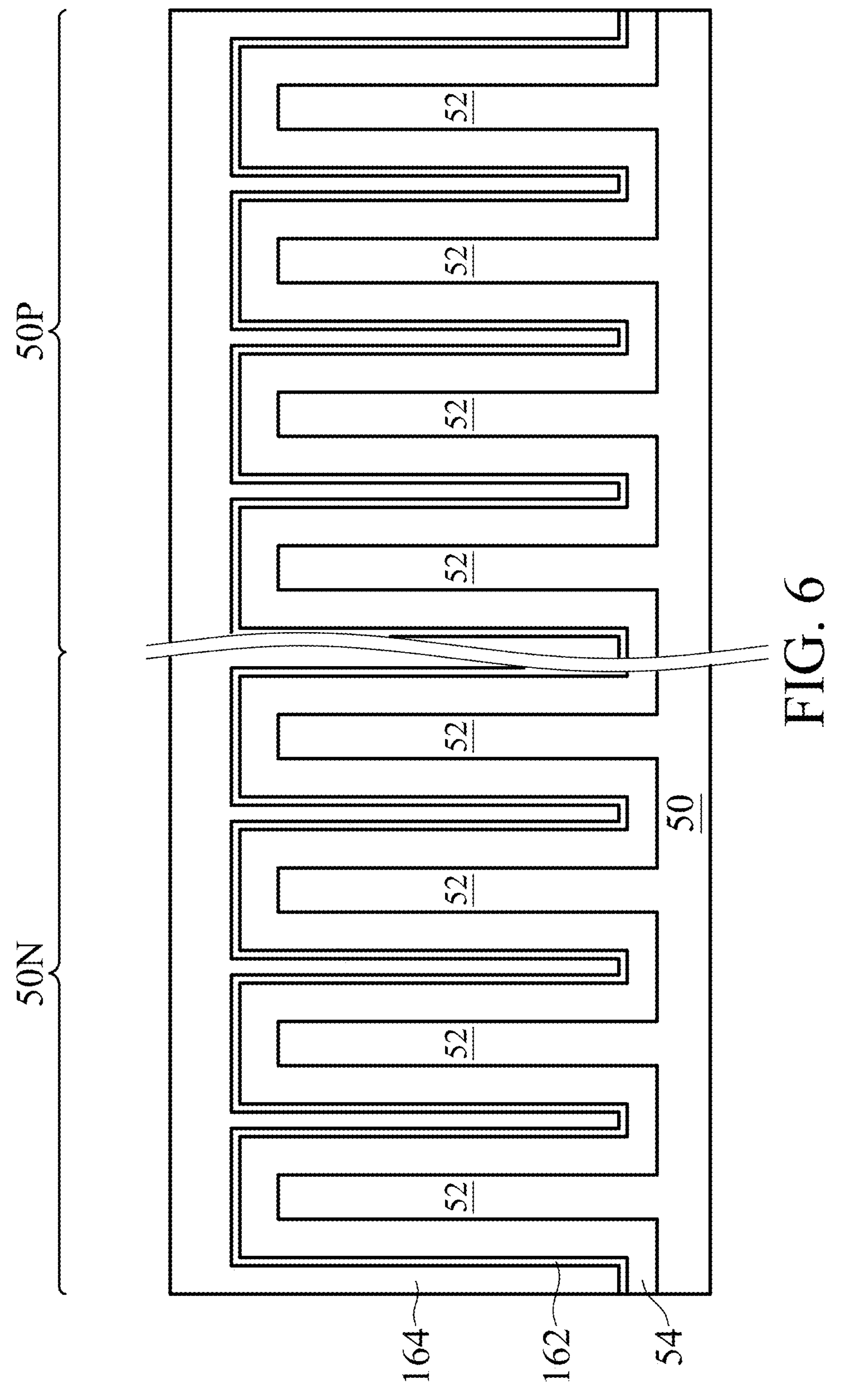

In FIG. 6, a flowable oxide 164 is formed over the high-k layer 162 by a flowable chemical vapor deposition (FCVD) method or an atomic layer deposition (ALD) method. The flowable oxide 164 is formed into the trenches 70 between adjacent semiconductor fins 52 so that the trenches 70 are completely filled. The flowable oxide 164 may comprise materials such as $SiO_2$, $Al_2O_3$, or the like. The FCVD process may be performed for a period of time between about 5 minutes and about 60 minutes at a temperature between about 30° C. and about 300° C. An anneal may be performed after the formation of the flowable oxide 164. The anneal may comprise $N_2$, $H_2O$, or a combination thereof. The anneal may be performed at a temperature between about 300° C. and about 1000° C. for a period of time between about 0.5 hours and about 10 hours. In an exemplary embodiment, the anneal is performed for about 2 to 4 hours at a temperature between about 400° C. and about 800° C.

Figure 7:
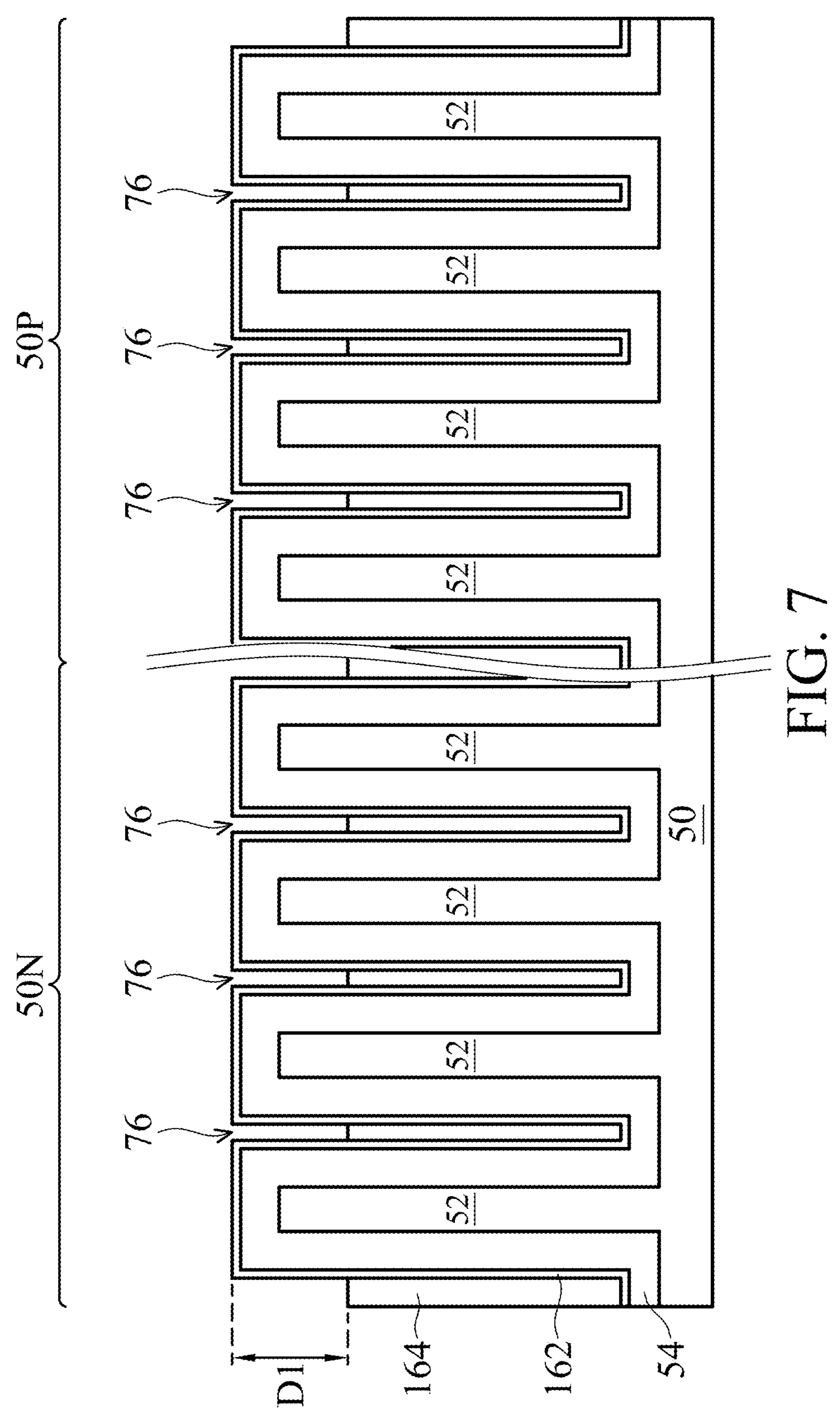

In FIG. 7, a removal process is applied to the flowable oxide 164 to remove excess flowable oxide 164 over the fins 52 and to recess the flowable oxide 164 below top surfaces of the fins 52. In some embodiments, a planarization process such as a chemical mechanical polish (CMP), an etch back process, combinations thereof, or the like may be utilized. The planarization process may expose top surfaces of the flowable oxide 164 over the fins 52 such that they are level with each other after the planarization process is complete.

The flowable oxide 164 may then be recessed such that upper portions of fins 52 in the region 50N and in the region 50P protrude from between neighboring regions of the flowable oxide 164, as shown in FIG. 7. The flowable oxide 164 may be recessed using an acceptable etching process, such as one that is selective to the material of the flowable oxide 164 (e.g., etches the material of the flowable oxide 164 at a faster rate than the material of the high-k layer 162). Wet or dry etching processes may be used. For an example of a wet etching process, a chemical oxide removal with a suitable etch process using, for example, dilute hydrofluoric (dHF) acid may be used. The flowable oxide 164 may be etched to a depth D1 below a top surface of the high-k layer 162 over the fins 52 in order to etch trenches 76, as shown in FIG. 7. A ratio of the depth D1 to the fin width W1 of the fins 52 may be between about 1:5 to about 30:1.

Figure 8:
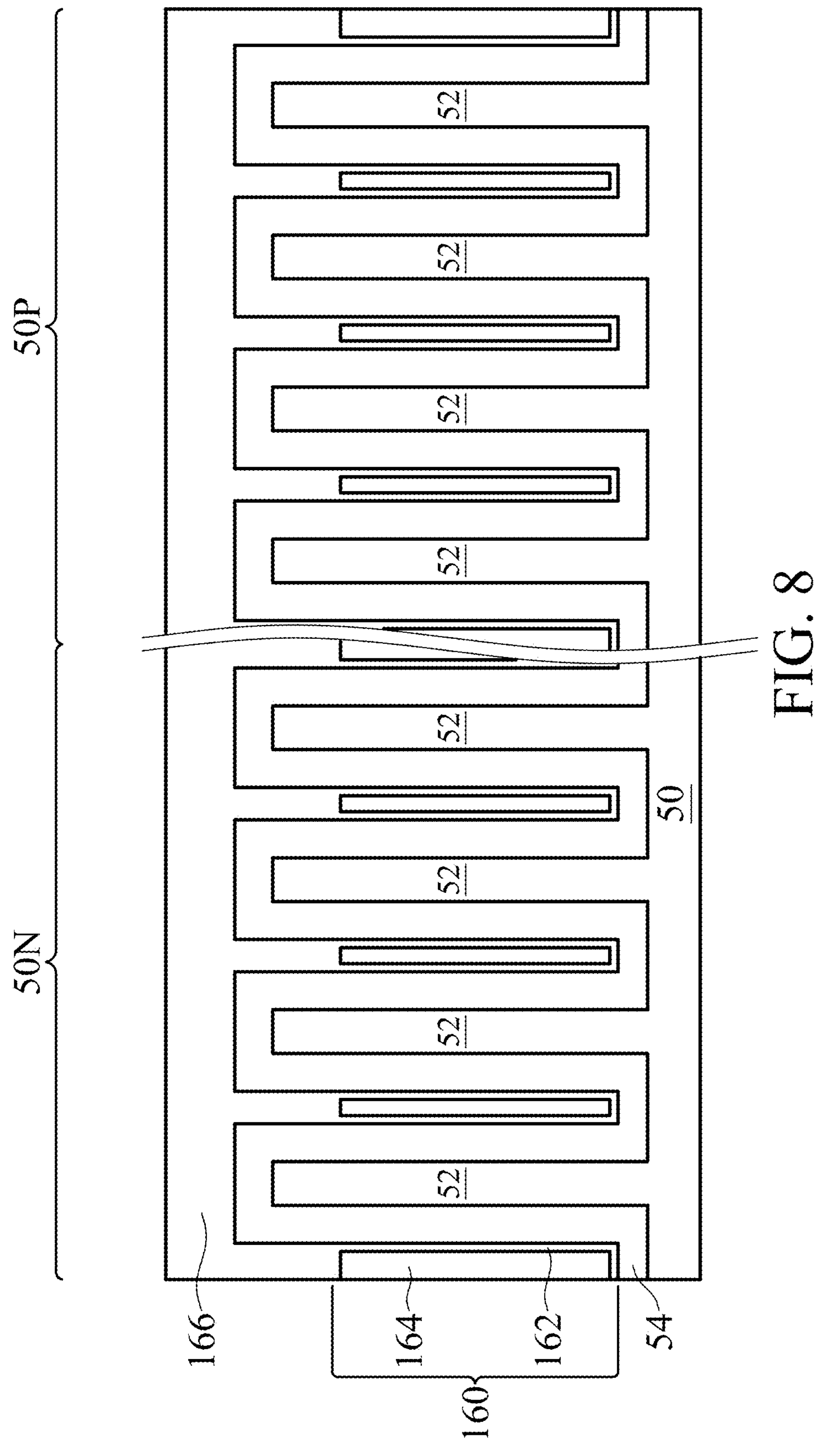

In FIG. 8, a high-k layer 166 is deposited over the fins 52, filling the trenches 76 between the fins 52. In some embodiments, the high-k layer 166 may comprise the same material as the high-k layer 162. In other embodiments, the high-k layer 166 may comprise different materials from the high-k layer 162. The high-k layer 166 may comprise $HfO_2$. In an embodiment, the high-k layer 166 comprises $HfO_2$ doped with Al, Zr, Si, and/or La. The high-k layer 166 may be formed by an ALD process. The ALD process may be performed for a period of time between about 0.5 s and about 60 s at a temperature between about 200° C. and about 500° C. In an exemplary embodiment, the ALD process is performed for a period of about 10 s at a temperature between about 200° C. and about 500° C.

Figure 9:
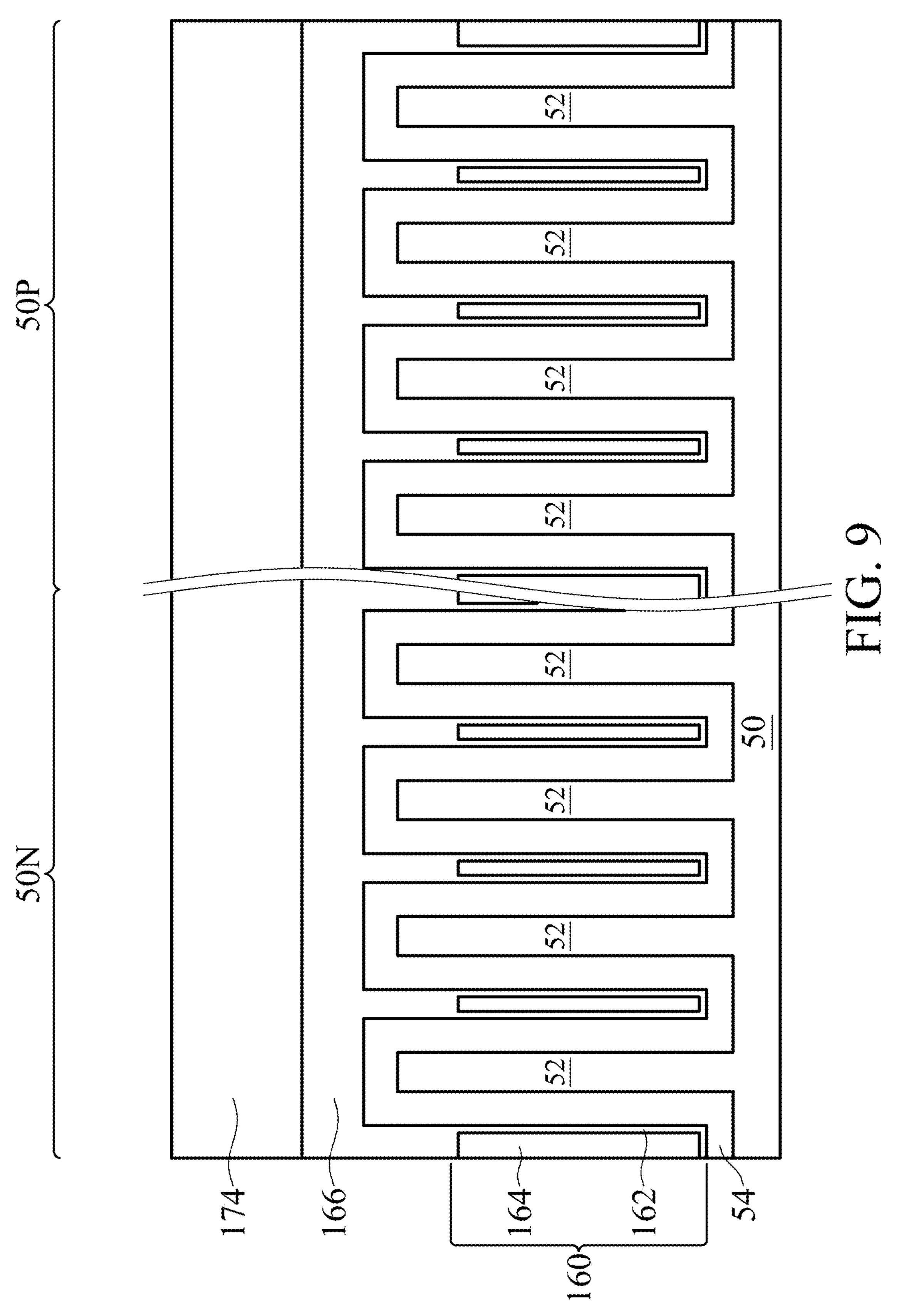

In FIG. 9, a flowable oxide 174 may be formed over the high-k layer 166 by a flowable chemical vapor deposition (FCVD) method or an atomic layer deposition (ALD) method. The flowable oxide 174 may comprise materials such as $SiO_2$, $Al_2O_3$, or the like. The FCVD process may be performed for a period of time between about 5 minutes and about 60 minutes at a temperature between about 30° C. and about 300° C.

Figure 10:
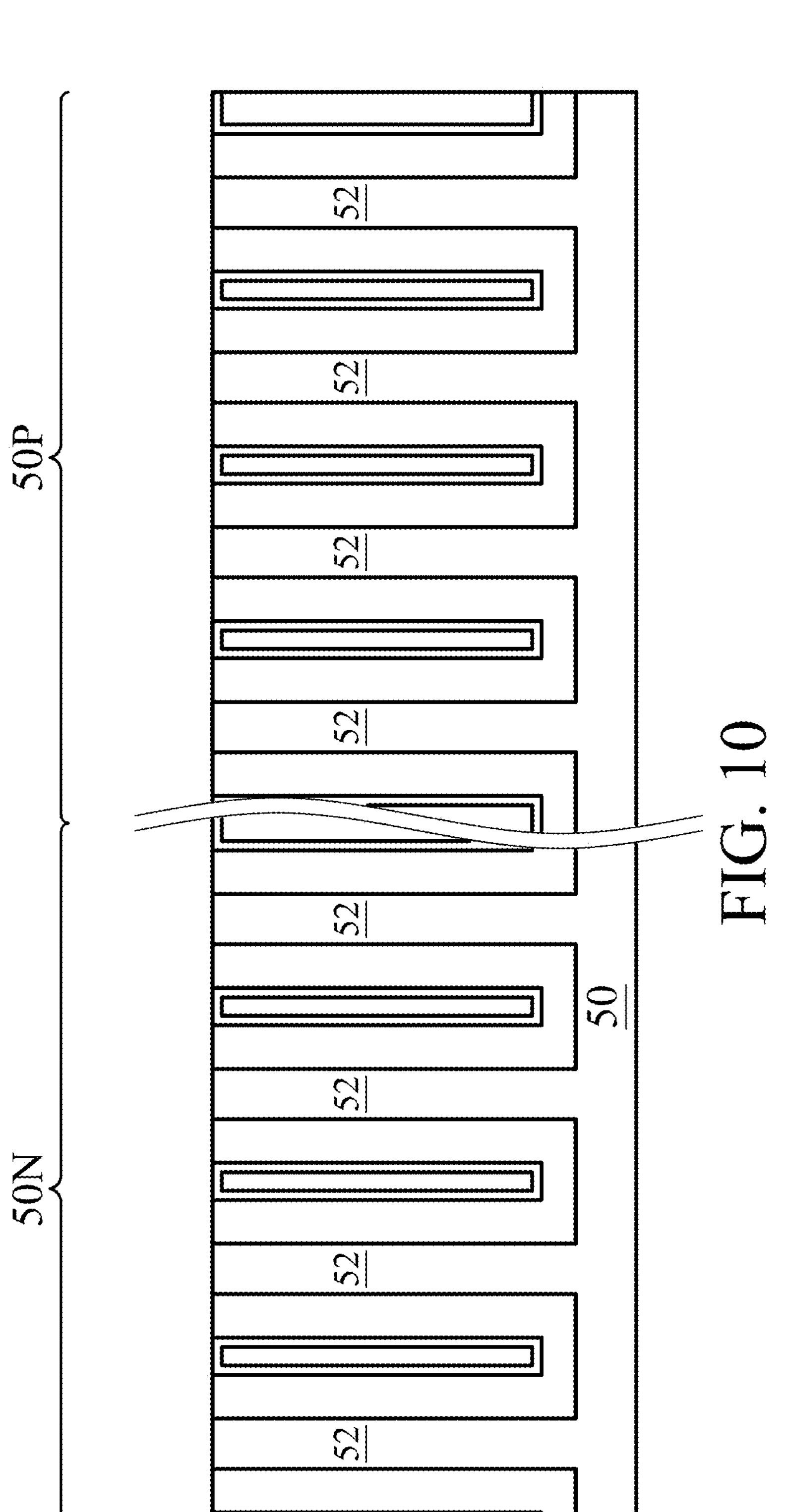

In FIG. 10, a removal process is applied to the flowable oxide 174, the high-k layer 166, and the dielectric layer 54 over the fins 52. In some embodiments, a planarization process such as a chemical mechanical polish (CMP), an etch back process, combinations thereof, or the like may be utilized. The planarization process may expose the fins 52 such that top surfaces of the fins 52 are level with top surfaces of the high-k layer 166 and with top surfaces of the dielectric layer 54 after the planarization process is complete. The high-k layer 162 and the remaining portions of high-k layer 166 together form high-k layer 168.

Figure 11:
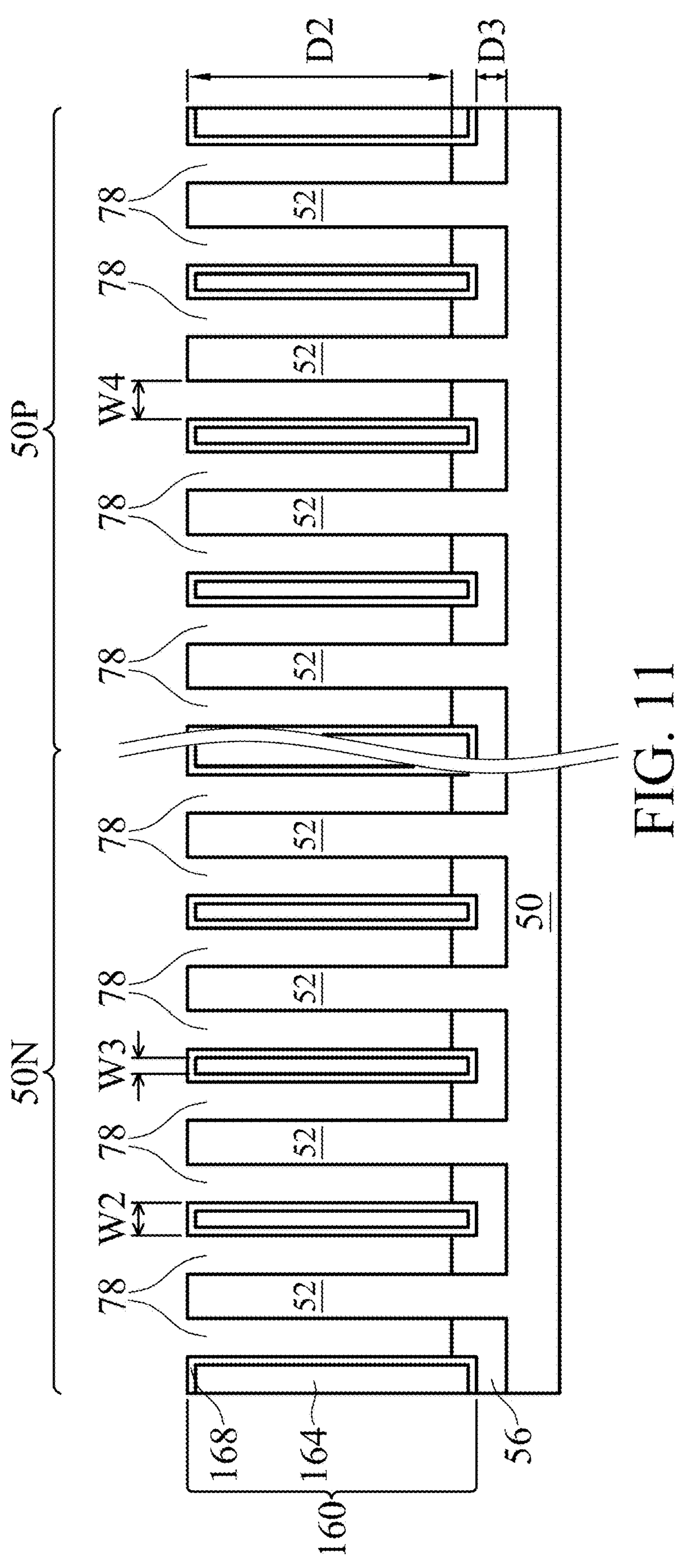

In FIG. 11, a fin recess is performed to form dummy fins 160. The dielectric layer 54 is recessed to form trenches 78 and to form Shallow Trench Isolation (STI) regions 56. Dummy fins 160 are formed from flowable oxide 164 and high-k layer 168. The dielectric layer 54 is recessed such that upper portions of fins 52 in the region 50N and in the region 50P protrude from between neighboring STI regions 56. The dielectric layer 54 may be recessed to a depth D2 below a surface level with the top surfaces of fins 52 and dummy fins 160. A ratio of the depth D2 to the fin height H1 of the fins 52 may be between about 1:8 to about 4:1. The dummy fins 160 have an outer width W2 between about 5 nm and about 100 nm measured between outer surfaces of sidewalls of the dummy fins 160 and an inner width W3 between about 2 nm and about 100 nm measured between sidewalls of the portions of the flowable oxide 164, as illustrated in FIG. 11. A ratio of the inner width W3 to the outer width W2 of the dummy fins may be between about 1:50 to about 20:1. The trenches 78 have a trench width W4 between about 5 nm and about 30 nm measured between outer surfaces of sidewalls of the fins 52 and outer surfaces of sidewalls of the dummy fins 160.

Furthermore, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the dielectric layer 54 (e.g., etches the material of the dielectric layer 54 at a faster rate than the material of the fins 52). Wet or dry etching processes may be used. For an example of a wet etching process, a chemical oxide removal with a suitable etch process using, for example, dilute hydrofluoric (dHF) acid may be used. The STI regions 56 have a depth D3 between about 5 nm and about 60 nm measured between a bottom surface of the dummy fins 160 and a bottom surface of the STI regions 56.

The process described with respect to FIGS. 2 through 11 is just one example of how the fins 52 and the dummy fins 160 may be formed. In some embodiments, the fins 52 may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 10 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 11, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52, the dummy fins 160, and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist is removed, such as by an acceptable ashing process.

Following the implanting of the region 50P, a photoresist is formed over the fins 52, the dummy fins 160, and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, $BF_2$, indium, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist may be removed, such as by an acceptable ashing process.

After the implants of the region 50N and the region 50P, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 12:
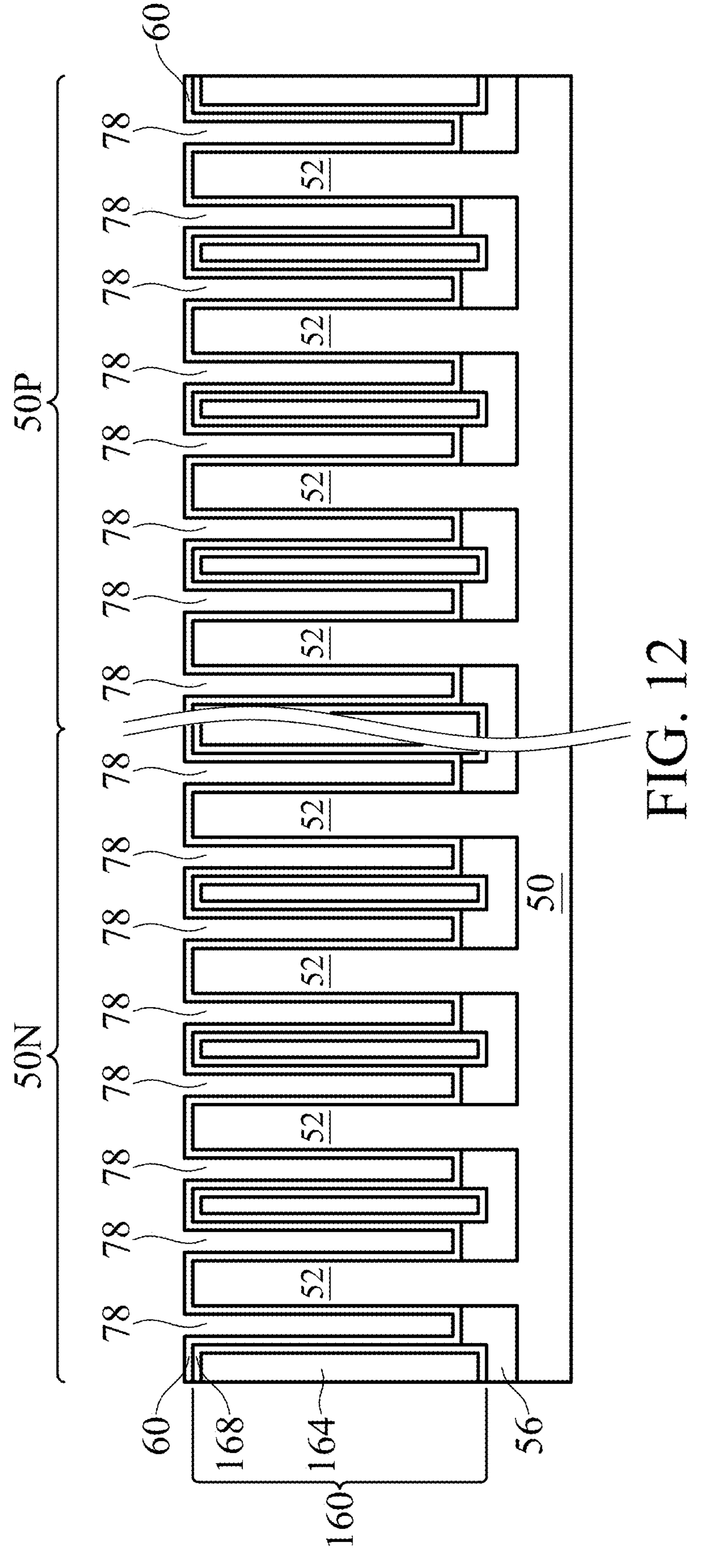

In FIG. 12, a gate dielectric layer 60 is formed on the fins 52 and on the dummy fins 160. The gate dielectric layer 60 may be, for example, silicon oxide, silicon nitride, a combination thereof, or the like, and may be deposited or thermally grown according to acceptable techniques. The gate dielectric layer 60 is formed on the exposed top surfaces and sidewalls of the fins 52 and on the dummy fins 160 without completed filling the trenches 78.

Figure 13:
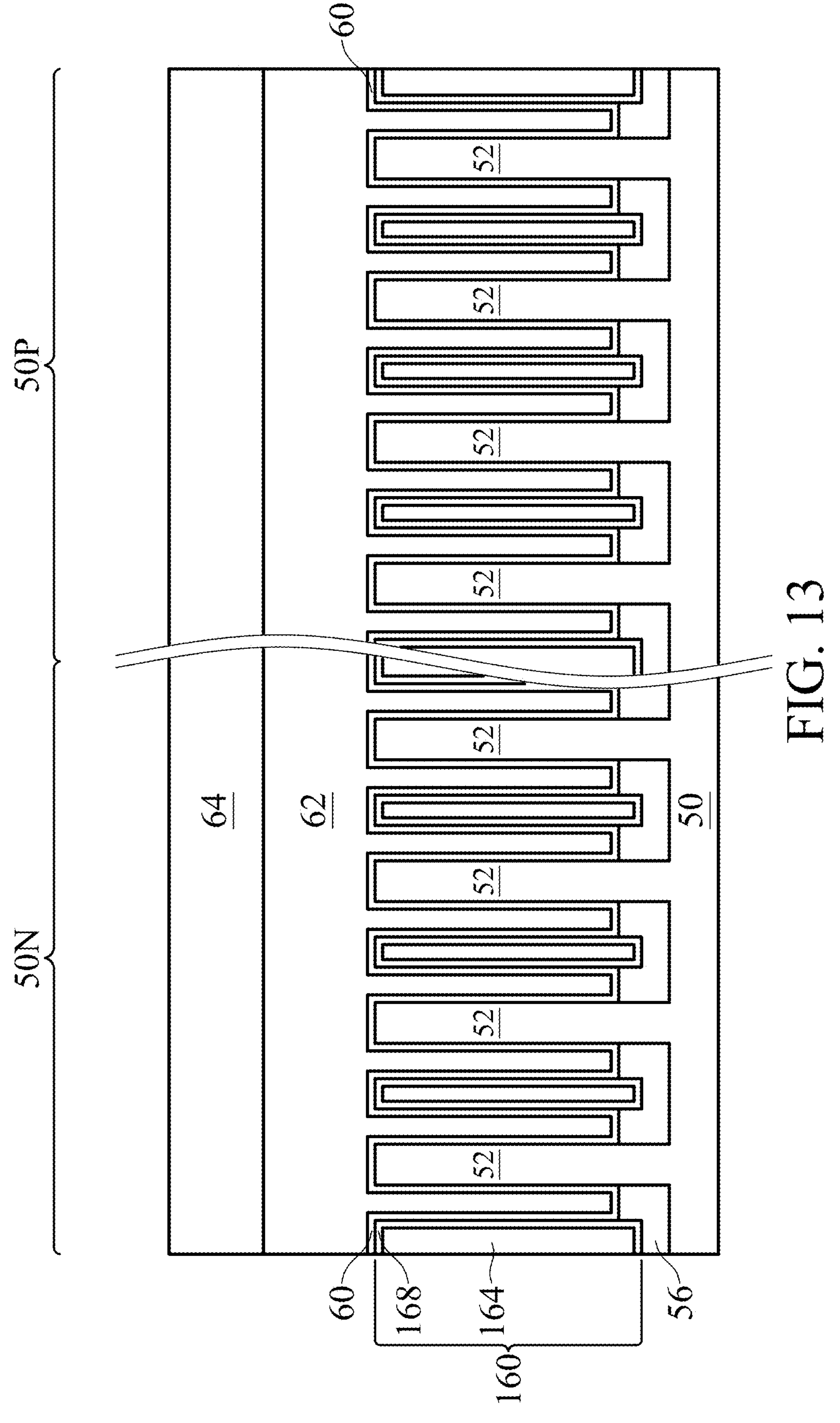

In FIG. 13, a dummy gate layer 62 is formed over the gate dielectric layer 60, filling the trenches 78, and a mask layer 64 is formed over the dummy gate layer 62. The dummy gate layer 62 may be deposited over the gate dielectric layer 60 and then planarized, such as by a CMP. The mask layer 64 may be deposited over the dummy gate layer 62. The dummy gate layer 62 may be a conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may include, for example, SiN, SiON, or the like. In this example, a single dummy gate layer 62 and a single mask layer 64 are formed across the region 50N and the region 50P.

Figure 14B:
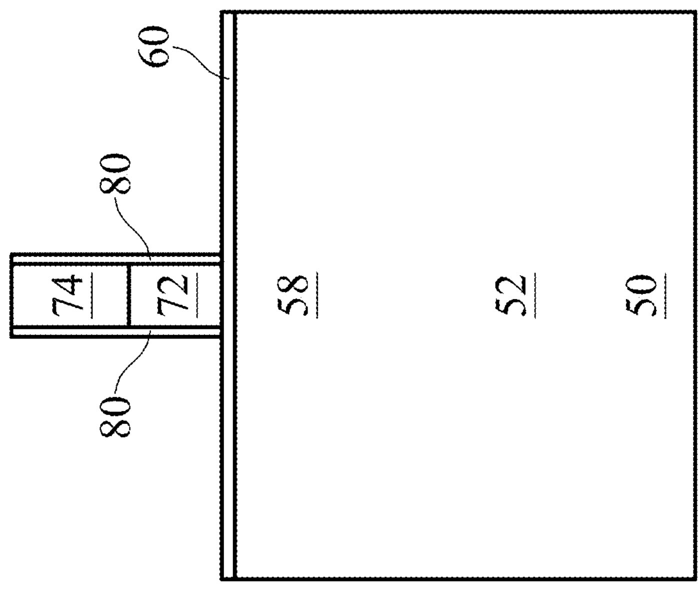
Figure 14A:
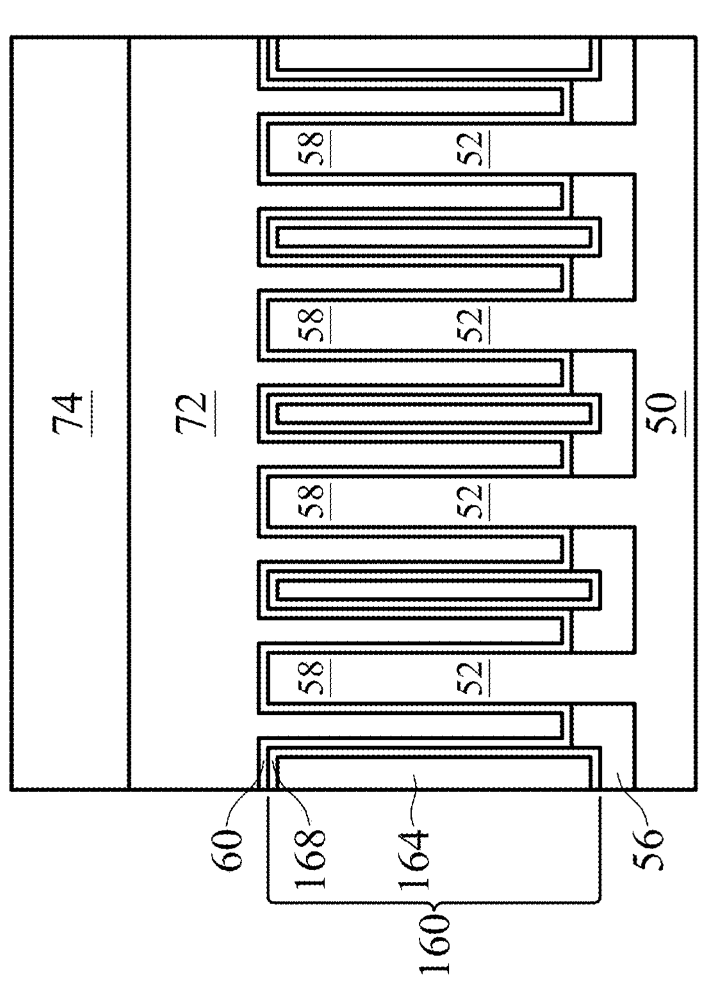

FIGS. 14A and 14B illustrate various additional steps in the manufacturing of embodiment devices. FIGS. 14A and 14B illustrate features in either of the region 50N and the region 50P. For example, the structures illustrated in FIGS. 14A and 14B may be applicable to both the region 50N and the region 50P. Differences (if any) in the structures of the region 50N and the region 50P are described in the text accompanying each figure.

In FIGS. 14A and 14B, the mask layer 64 (see FIG. 13) may be patterned using acceptable photolithography and etching techniques to form masks 74. The pattern of the masks 74 then may be transferred to the dummy gate layer 62. In some embodiments (not illustrated), the pattern of the masks 74 may also be transferred to the gate dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective fins 52.

Further in FIGS. 14A and 14B, gate seal spacers 80 can be formed on exposed surfaces of the dummy gates 72, the masks 74, and/or the fins 52. A thermal oxidation or a deposition followed by an anisotropic etch may form the gate seal spacers 80.

After the formation of the gate seal spacers 80, implants for lightly doped source/drain (LDD) regions (not explicitly illustrated) may be performed. In the embodiments with different device types, similar to the implants discussed above in FIG. 11, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ $cm^{-3}$ to about $10^{16}$ $cm^{-3}$. An anneal may be used to activate the implanted impurities.

Figure 15B:
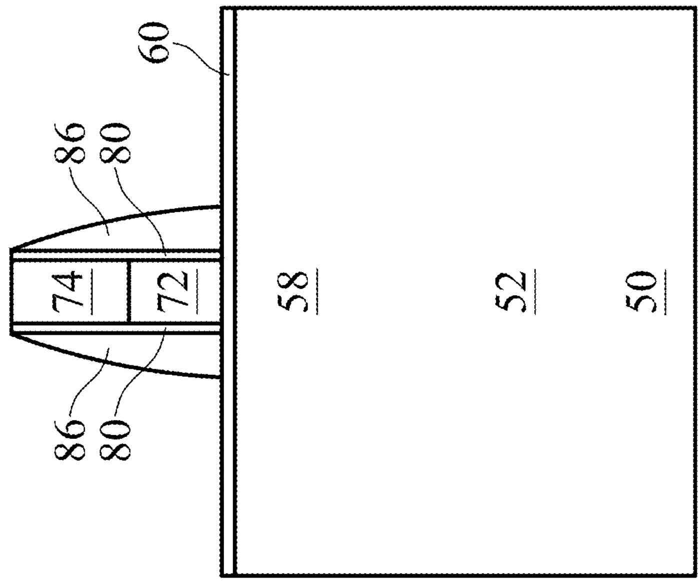
Figure 15A:
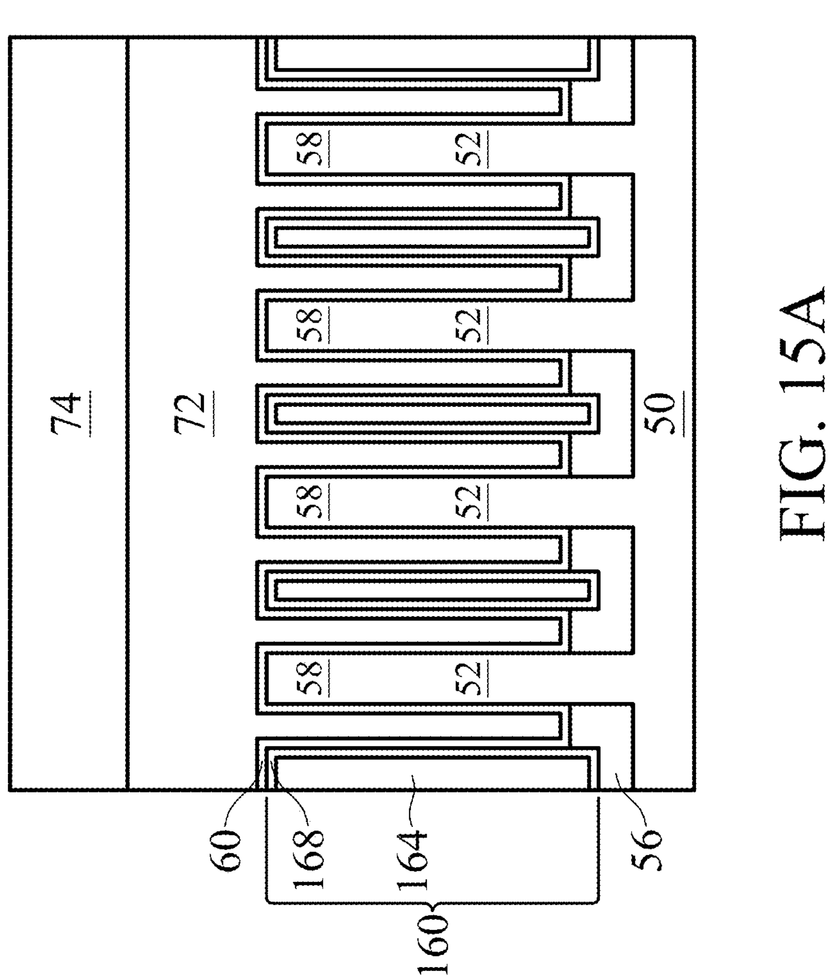

In FIGS. 15A and 15B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon nitride, SiCN, a combination thereof, or the like. As illustrated below in FIGS. 16C and 16D, portions of the gate spacers 86 may be formed between sidewalls of the fins 52 and the dummy fins 160.

Figure 16B:
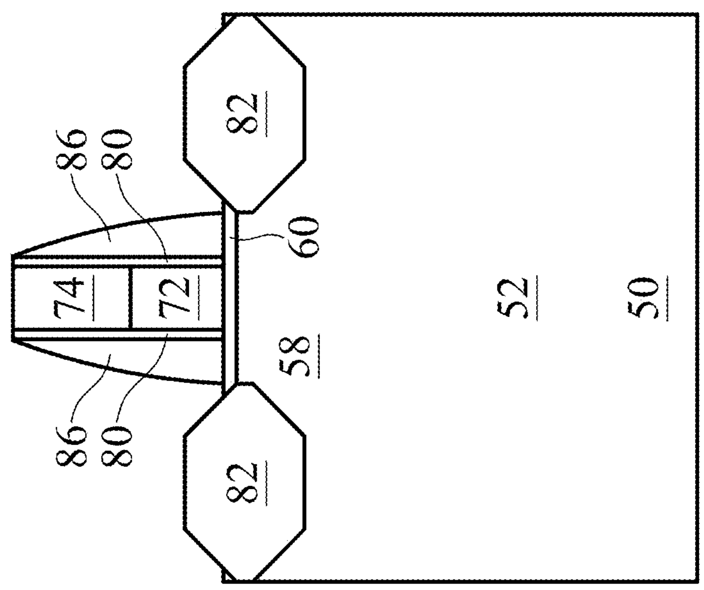
Figure 16A:
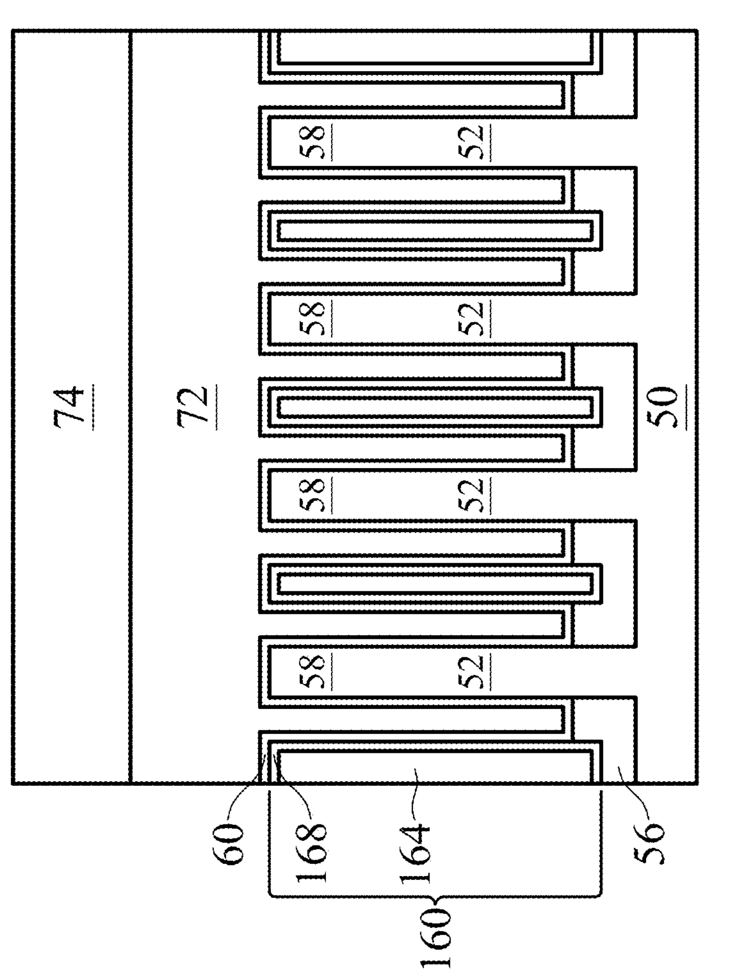

In FIGS. 16A and 16B epitaxial source/drain regions 82 are formed in the fins 52 to exert stress in the respective channel regions 58, thereby improving performance. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the region 50N may include materials exerting a tensile strain in the channel region 58, such as silicon, SiC, SiCP, SiP, or the like. The epitaxial source/drain regions 82 in the region 50N may have surfaces raised from respective surfaces of the fins 52 and may have facets.

The epitaxial source/drain regions 82 in the region 50P, e.g., the PMOS region, may be formed by masking the region 50N, e.g., the NMOS region, and etching source/drain regions of the fins 52 in the region 50P are etched to form recesses in the fins 52. Then, the epitaxial source/drain regions 82 in the region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the region 50P may comprise materials exerting a compressive strain in the channel region 58, such as SiGe, SiGeB, Ge, GeSn, or the like. The epitaxial source/drain regions 82 in the region 50P may also have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ $cm^{-3}$ and about $10^{21}$ $cm^{-3}$. The n-type and/or p-type impurities for source/drain regions may be any of the impurities previously discussed. In some embodiments, the epitaxial source/drain regions 82 may be in situ doped during growth.

Figures 16C, 16D, 16E, 16F:
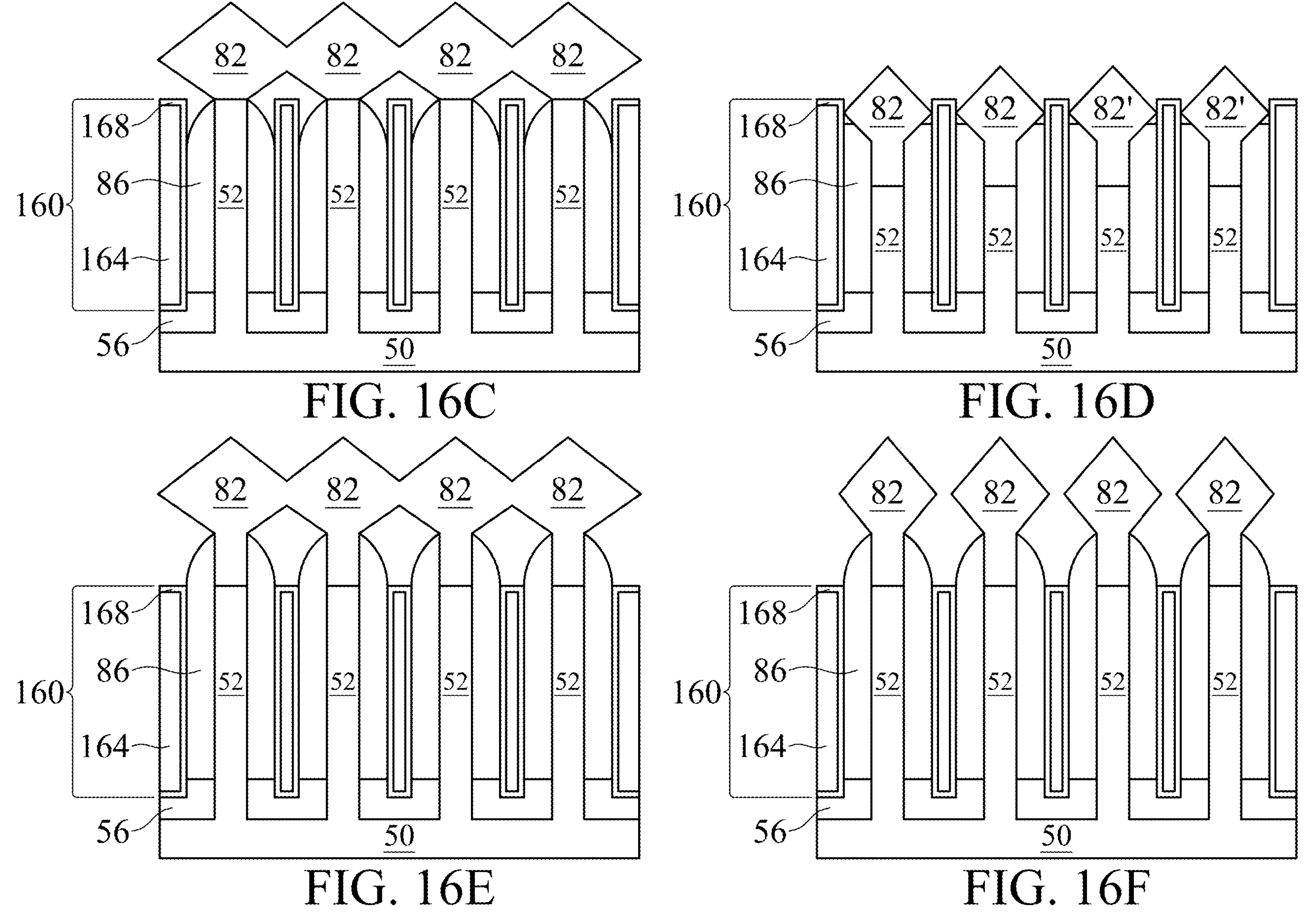

As a result of the epitaxy processes used to form the epitaxial source/drain regions 82 in the region 50N and the region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIGS. 16C and 16E. In other embodiments, adjacent source/drain regions 82 remain separated after the epitaxy process is completed as illustrated by FIGS. 16D and 16F. In the embodiments illustrated in FIGS. 16C and 16D, top surfaces of the gate spacers 86 are located below top surfaces of the dummy fins 160. In FIG. 16D, the epitaxial source/drain regions 82 and the epitaxial source/drain regions 82' are separated by the dummy fins 160. This separation of the epitaxial source/drain regions 82 and the epitaxial source/drain regions 82' by the dummy fins 160 may prevent electrical shorts between neighboring epitaxial source/drain regions 82 and 82', such as e.g. when epitaxial source/drain regions 82 are N-type source/drain regions and epitaxial source/drain regions 82' are P-type source/drain regions, or when epitaxial source/drain regions 82 are P-type source/drain regions and epitaxial source/drain regions 82' are N-type source/drain regions. In other embodiments, the top surfaces of the gate spacers 86 may extend above top surfaces of the dummy fins 160, as illustrated in FIGS. 16E and 16F.

Figure 17B:
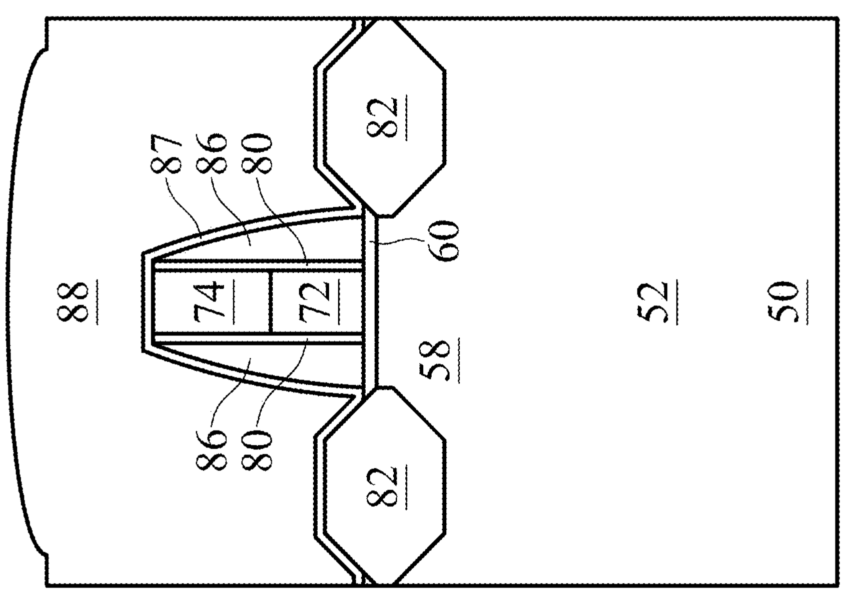
Figure 17A:
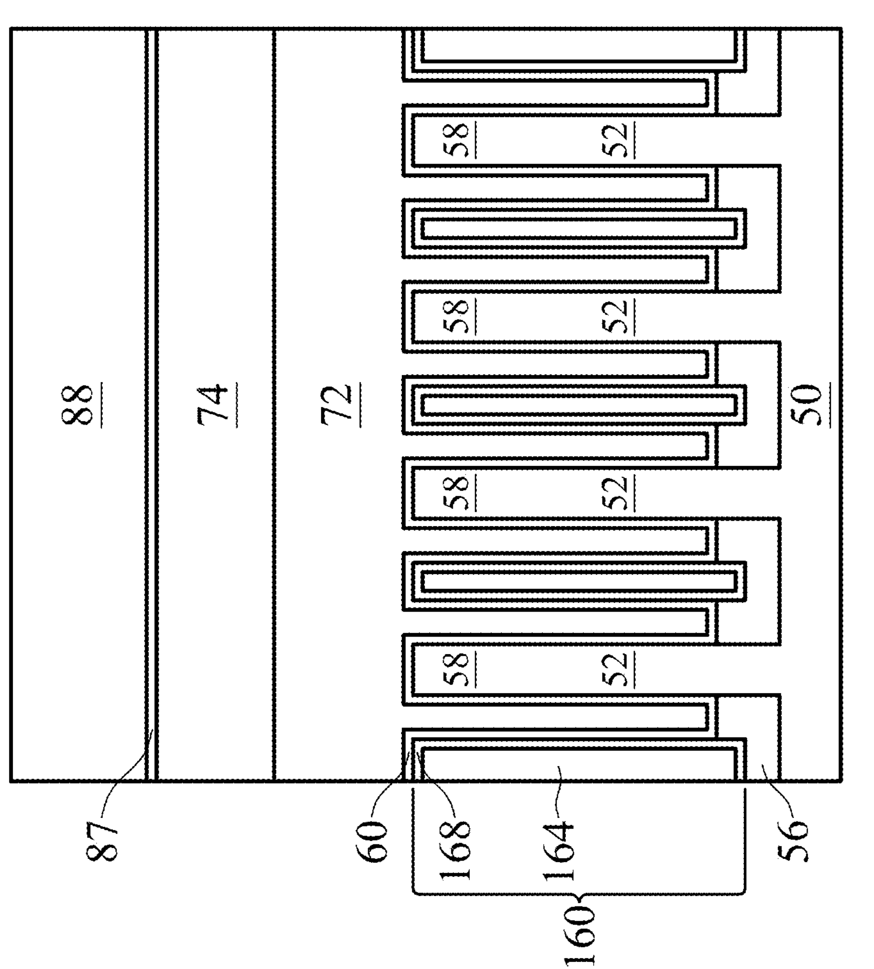

In FIGS. 17A and 17B, an ILD 88 is deposited over the structure illustrated in FIGS. 10A and 10B. The ILD 88 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used. In some embodiments, a contact etch stop layer (CESL) 87 is disposed between the ILD 88 and the epitaxial source/drain regions 82, the masks 74, and the gate spacers 86. The CESL 87 may comprise a dielectric material, such as, silicon nitride, silicon oxide, silicon oxynitride, or the like, having a different etch rate than the material of the overlying ILD 88.

Figure 18B:
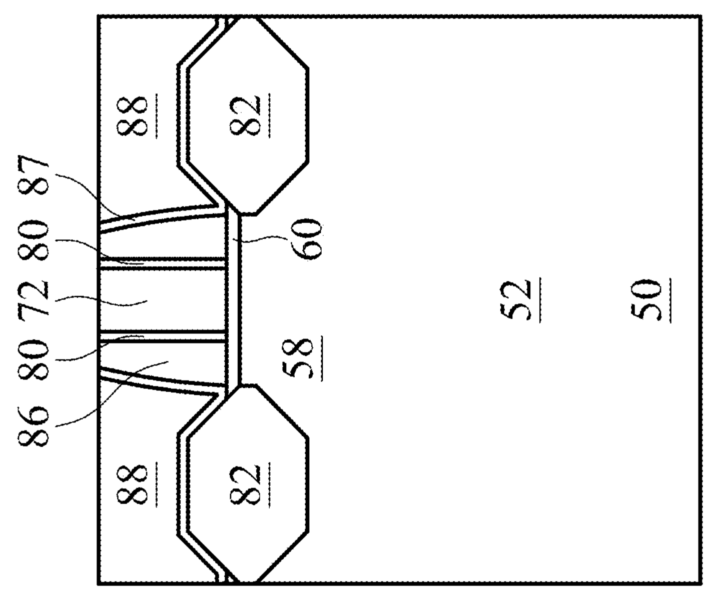
Figure 18A:
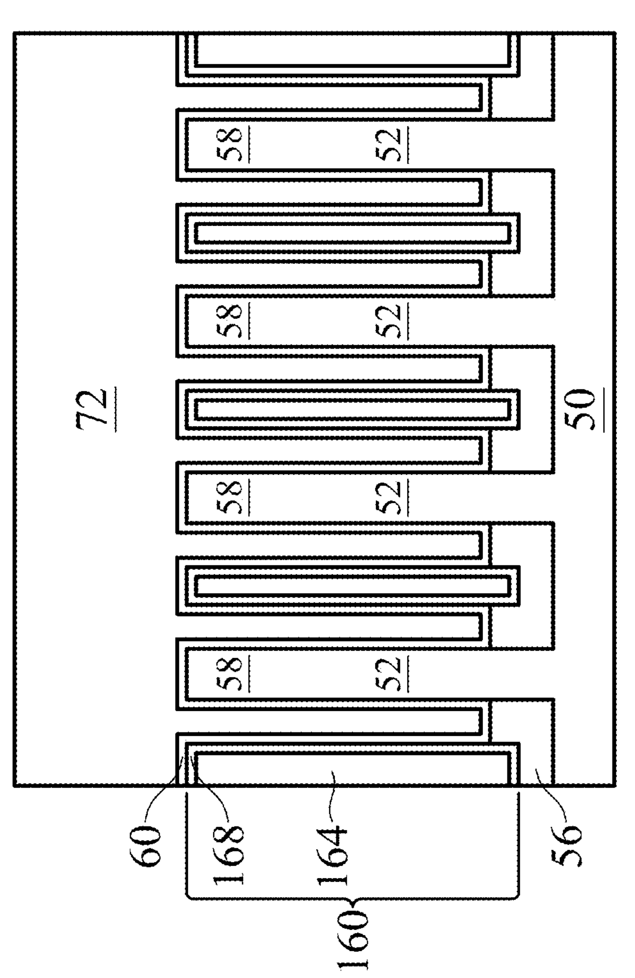

In FIGS. 18A and 18B, a planarization process, such as a CMP, may be performed to level the top surface of the ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the ILD 88 are level. Accordingly, the top surfaces of the dummy gates 72 are exposed through the ILD 88. In some embodiments, the masks 74 may remain, in which case the planarization process levels the top surface of the ILD 88 with the top surfaces of the gate seal spacers 80 and the top surface of the masks 74.

Figure 19B:
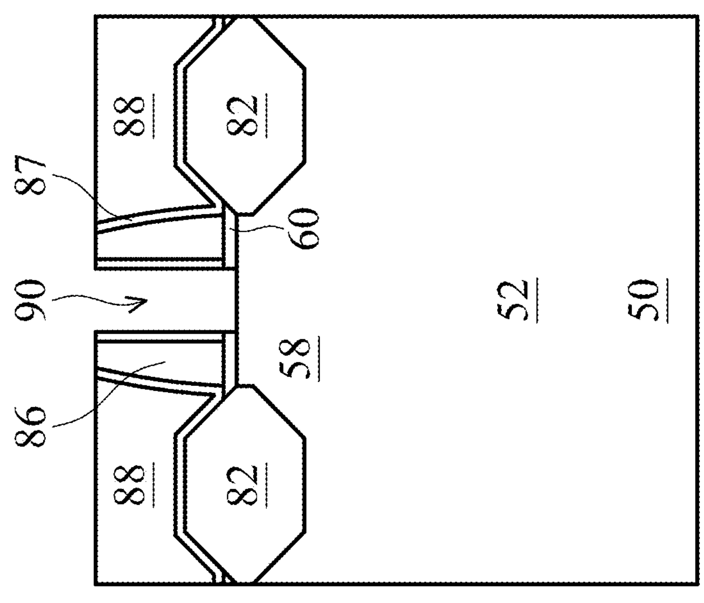
Figure 19A:
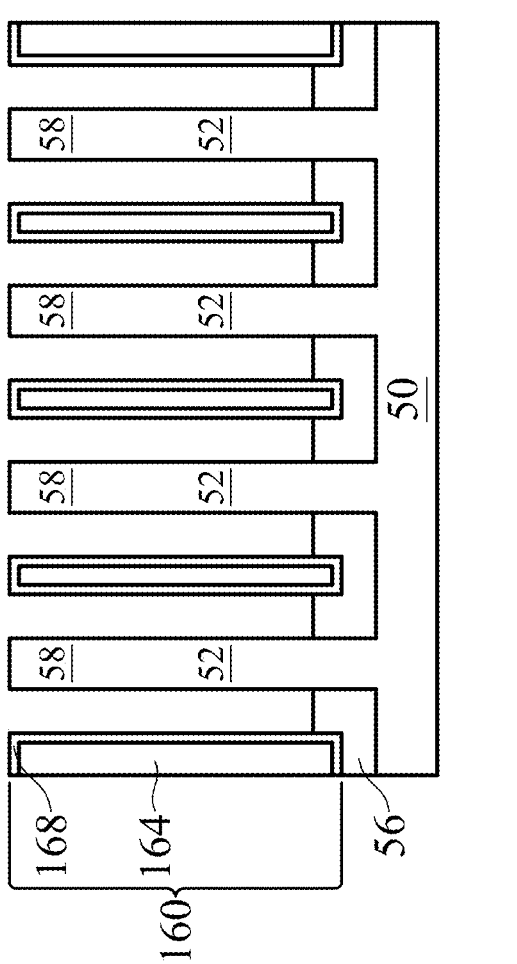

In FIGS. 19A and 19B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the ILD 88 or the gate spacers 86. Each recess 90 exposes or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 20B:
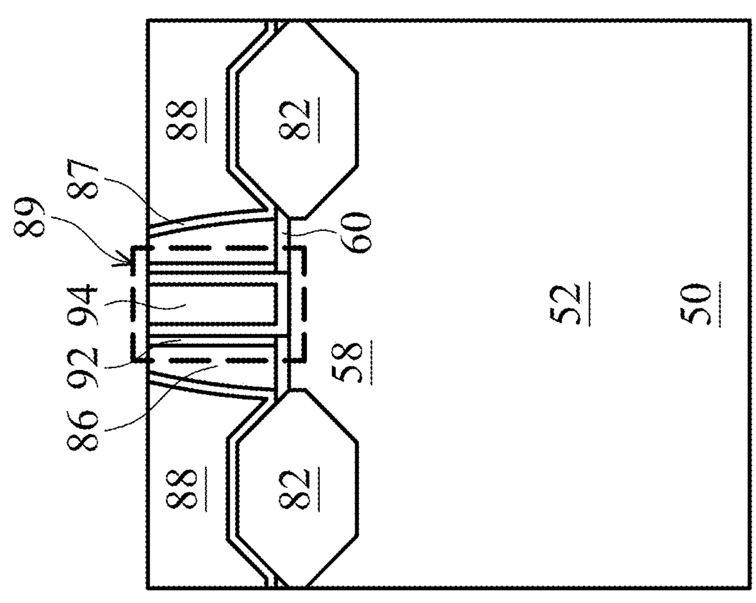
Figure 20A:
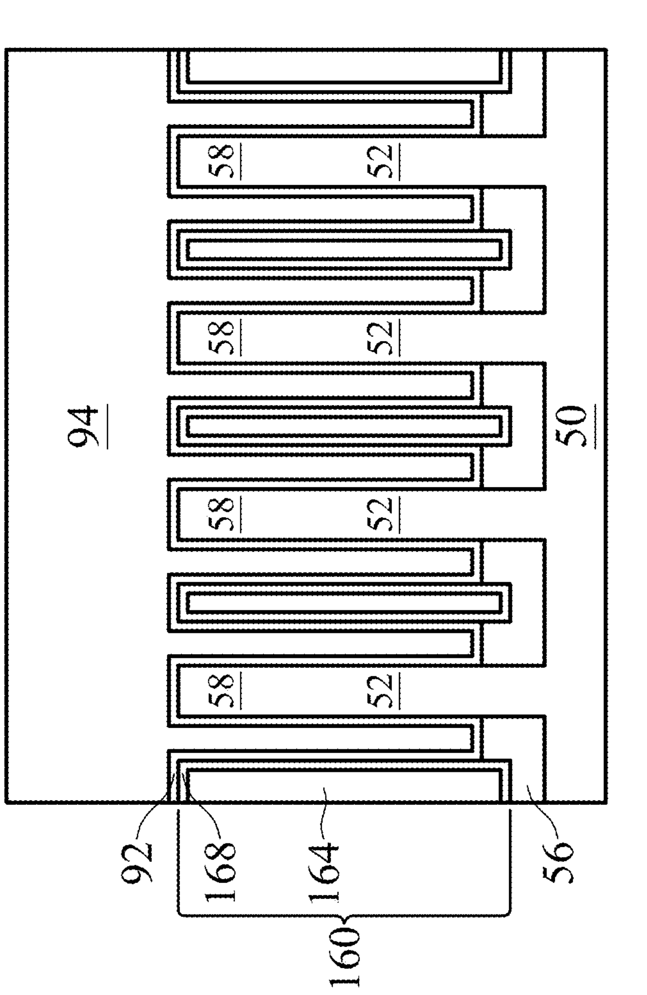
Figure 20C:
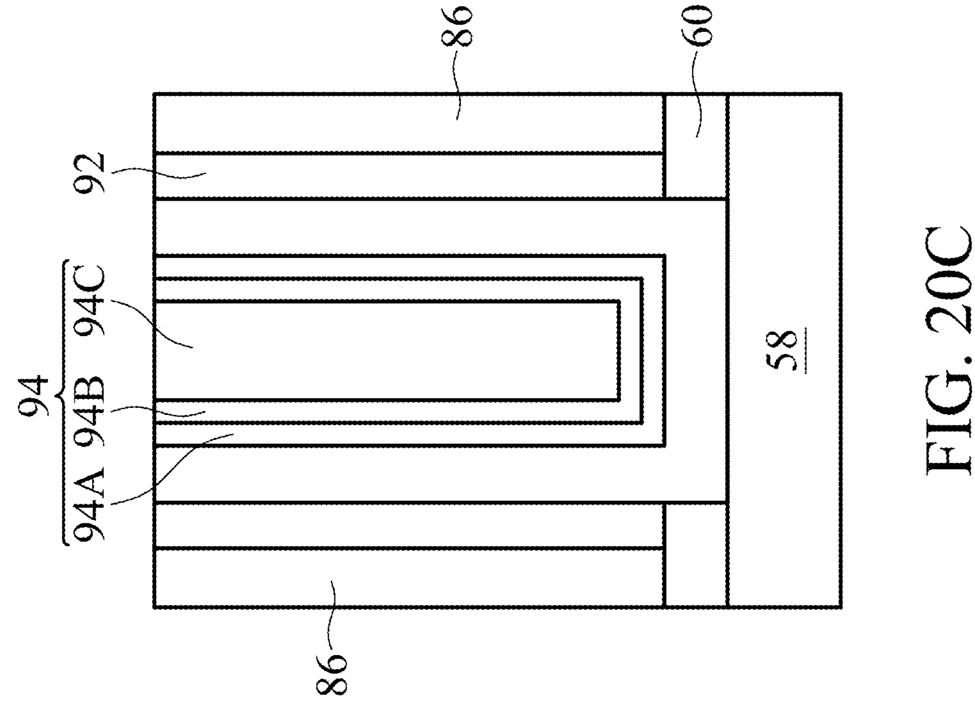

In FIGS. 20A and 20B, gate dielectric layers 92 and gate electrodes 94 are formed for replacement gates. FIG. 20C illustrates a detailed view of region 89 of FIG. 20B. Gate dielectric layers 92 are deposited conformally in the recesses 90, such as on the top surfaces and the sidewalls of the fins 52 and on sidewalls of the gate seal spacers 80/gate spacers 86. The gate dielectric layers 92 may also be formed on top surface of the ILD 88. In accordance with some embodiments, the gate dielectric layers 92 comprise silicon oxide, silicon nitride, or multilayers thereof. In some embodiments, the gate dielectric layers 92 include a high-k dielectric material, and in these embodiments, the gate dielectric layers 92 may have a k value greater than about 7.0, and may include a metal oxide or a silicate of Hf, Al, Zr, La, Mg, Ba, Ti, Pb, and combinations thereof. In some embodiments, the gate dielectric layers 92 comprise the same material as high-k layer 162 or high-k layer 166. In other embodiments, gate dielectric layers 92 comprise different materials as high-k layer 162 or high-k layer 166. The formation methods of the gate dielectric layers 92 may include Molecular-Beam Deposition (MBD), ALD, PECVD, and the like. In embodiments where portions of the dummy gate dielectric 60 remains in the recesses 90, the gate dielectric layers 92 include a material of the dummy gate dielectric 60 (e.g., $SiO_2$).

The gate electrodes 94 are deposited over the gate dielectric layers 92, respectively, and fill the remaining portions of the recesses 90. The gate electrodes 94 may include a metal-containing material such as TiN, TiO, TaN, TaC, Co, Ru, Al, W, combinations thereof, or multi-layers thereof. For example, although a single layer gate electrode 94 is illustrated in FIG. 20B, the gate electrode 94 may comprise any number of liner layers 94A, any number of work function tuning layers 94B, and a fill material 94C as illustrated by FIG. 20C. After the filling of the gate electrodes 94, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the region 50N and the region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 21B:
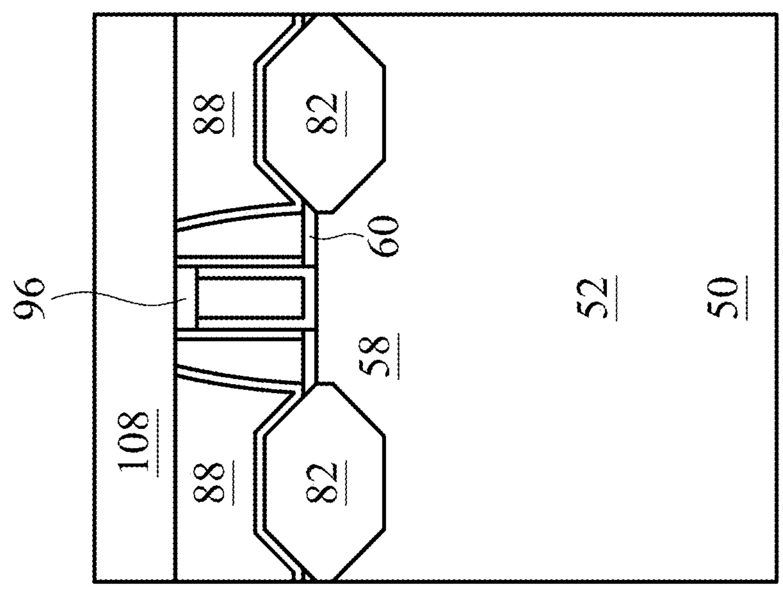
Figure 21A:
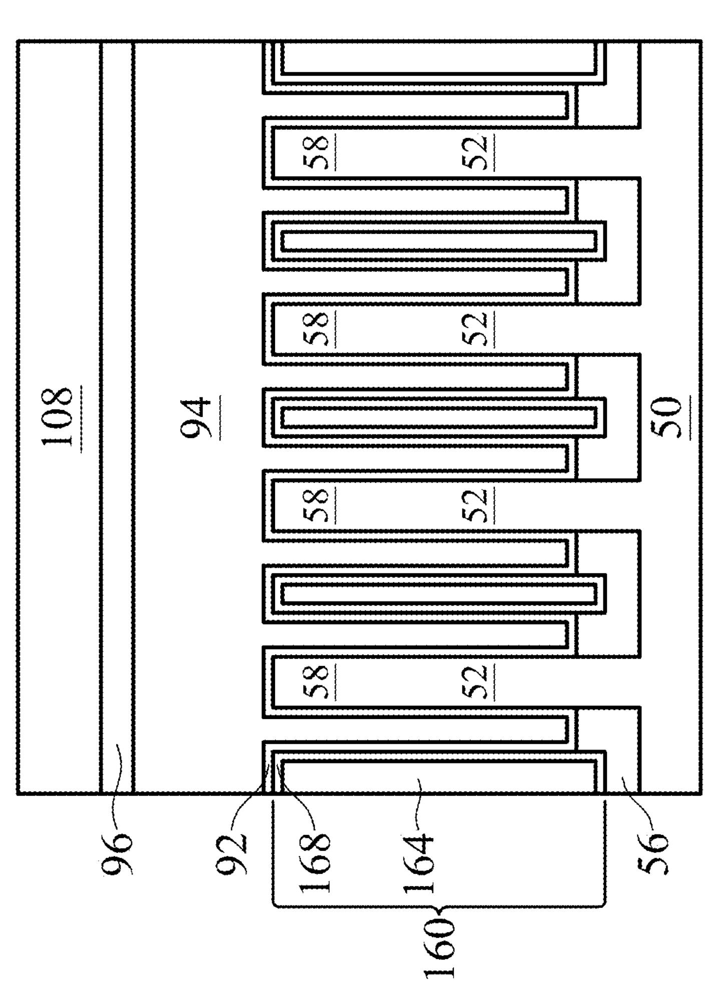

In FIGS. 21A and 21B, an ILD 108 is deposited over the ILD 88. In some embodiment, the ILD 108 is a flowable film formed by a flowable CVD method. In some embodiments, the ILD 108 is formed of a dielectric material such as PSG, BSG, BPSG, USG, or the like, and may be deposited by any suitable method, such as CVD and PECVD. In accordance with some embodiments, before the formation of the ILD 108, the gate stack (including a gate dielectric layer 92 and a corresponding overlying gate electrode 94) is recessed, so that a recess is formed directly over the gate stack and between opposing portions of gate spacers 86, as illustrated in FIGS. 21A and 21B. A gate mask 96 comprising one or more layers of dielectric material, such as silicon nitride, silicon oxynitride, or the like, is filled in the recess, followed by a planarization process to remove excess portions of the dielectric material extending over the ILD 88. The subsequently formed gate contacts 110 (FIGS. 16A and 16B) penetrate through the gate mask 96 to contact the top surface of the recessed gate electrode 94.

Figure 22B:
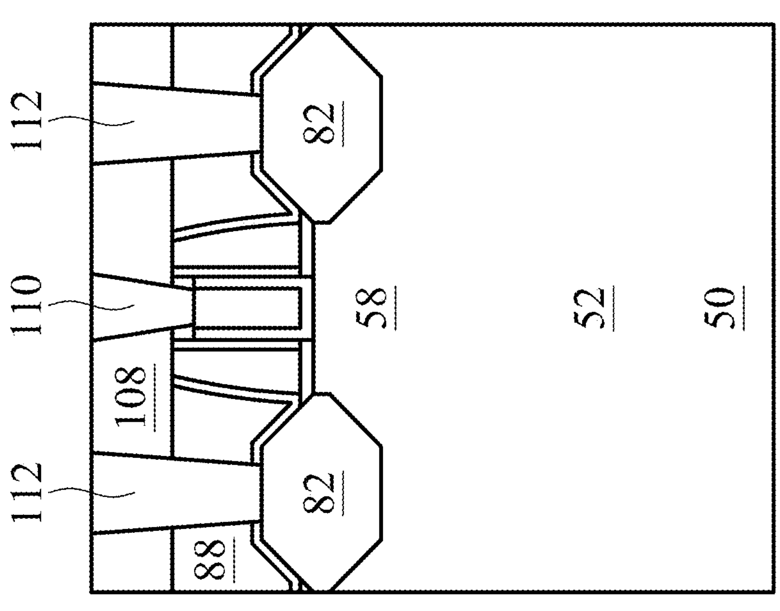
Figure 22A:
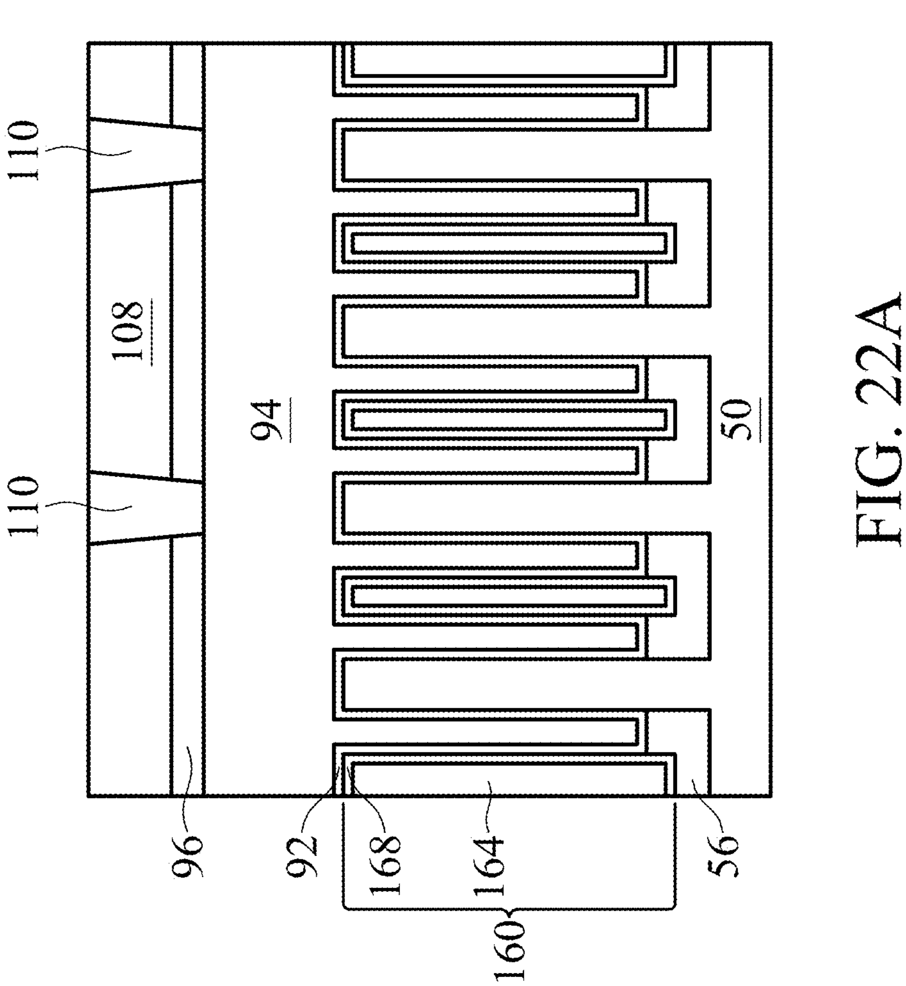

In FIGS. 22A and 22B, gate contacts 110 and source/drain contacts 112 are formed through the ILD 108 and the ILD 88 in accordance with some embodiments. Openings for the source/drain contacts 112 are formed through the first and ILDs 88 and 108, and openings for the gate contact 110 are formed through the ILD 108 and the gate mask 96. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 94. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

As discussed above, embodiments of this bi-layer approach to gap filling by forming a dummy fin with an atomic layer deposition (ALD) of a high-k layer and a deposition of a flowable oxide may prevent serious fin-to-fin bending effects and formation of seams and/or voids in the interior of the dummy fin. Using the lower-k flowable oxide to complete the dummy fin formation will reduce the intermolecular forces between the HK regions of neighboring fins and lower the dielectric constant k of the dummy fin, which will prevent RC delay and degradation of AC performance.

In an embodiment, a method of manufacturing a device includes: forming a dielectric layer conformally over a plurality of fins on a substrate, forming a first high-k layer conformally over the dielectric layer, forming a flowable oxide over the first high-k layer, in which forming the flowable oxide includes filling first trenches adjacent fins of the plurality of fins, recessing the flowable oxide to form second trenches between adjacent fins of the plurality of fins, forming a second high-k layer over the first high-k layer and the flowable oxide, in which forming the second high-k layer includes filling the second trenches, performing a planarization, in which the planarization exposes top surfaces of the plurality of fins, and in which the exposed top surfaces of the plurality of fins are level with top surfaces of the second high-k layer and with top surfaces of the dielectric layer, and recessing the dielectric layer to form a plurality of dummy fins, in which the dummy fins include remaining portions of the first and second high-k layers and the flowable oxide. In an embodiment, the first high-k layer and the second high-k layer include the same material. In an embodiment, the first high-k layer includes a different material from the second high-k layer. In an embodiment, the second trenches are formed with a depth measured between bottom surfaces of the second trenches and top surfaces of the first high-k layer over the plurality of fins, in which the plurality of fins has a fin width measured between sidewalls of adjacent fins, and in which a ratio of the depth to the fin width is between about 1:5 to about 30:1. In an embodiment, depositing the flowable oxide consists of a flowable chemical vapor deposition (FCVD) process. In an embodiment, an anneal is performed on the flowable oxide after the FCVD process. In an embodiment, the first and second high-k layers include $HfO_2$ doped with at least one out of the group of Al, Zr, Si, and La.

In accordance with another embodiment, a method for forming a semiconductor device includes: recessing a substrate to form a plurality of semiconductor fins and a plurality of first trenches between the plurality of semiconductor fins, depositing a dielectric film over the plurality of semiconductor fins and in the plurality of first trenches, depositing a first high-k dielectric layer conformally over the dielectric film and in the plurality of first trenches, filling the plurality of first trenches with an oxide, etching the oxide to form a plurality of second trenches between the plurality of semiconductor fins, filling the plurality of second trenches with a second high-k dielectric layer, planarizing the second high-k dielectric layer, the first high-k dielectric layer, and the plurality of semiconductor fins, in which after the planarization top surfaces of the plurality of semiconductor fins are level with top surfaces of the second high-k dielectric layer and with top surfaces of the dielectric film, recessing the dielectric film to form a plurality of dummy structures, wherein the dummy structures comprise remaining portions of the first and second high-k dielectric layers and the oxide, depositing a gate dielectric layer over the plurality of semiconductor fins and the plurality of dummy structures, and forming a dummy gate over the gate dielectric layer. In an embodiment, forming the dummy gate includes forming portions disposed between sidewalls of the plurality of semiconductor fins and the plurality of dummy structures. In an embodiment, the method further includes forming gate spacers along sidewalls of the dummy gate, in which portions of the gate spacers are disposed between sidewalls of the plurality of semiconductor fins and the plurality of dummy structures. In an embodiment, the method includes removing the dummy gate and forming a gate stack over the plurality of semiconductor fins and the plurality of dummy structures, in which the gate stack comprises portions disposed between sidewalls of the plurality of semiconductor fins and the plurality of dummy structures. In an embodiment, recessing the dielectric film includes a wet etching process. In an embodiment, recessing the dielectric film includes a dry etching process.

In accordance with yet another embodiment, a device consists of a plurality of semiconductor fins extending from a substrate, a plurality of dummy fins disposed between the plurality of semiconductor fins, in which the dummy fins include an inner portion and an outer portion encapsulating the inner portion, in which the inner portion includes $SiO_2$, and in which the outer portion includes a high-k dielectric layer, and a plurality of shallow trench isolation (STI) regions located over the substrate, between adjacent semiconductor fins, and below the dummy fins. In an embodiment, the device further includes a gate stack over the plurality of semiconductor fins and the plurality of dummy fins, in which the gate stack includes portions disposed between sidewalls of the plurality of semiconductor fins and the plurality of dummy fins. In an embodiment, the gate stack includes a gate electrode and a gate dielectric layer, in which the gate dielectric layer is disposed along sidewalls and top surfaces of the plurality of semiconductor fins and the plurality of dummy fins and along top surfaces of the STI regions. In an embodiment, the gate dielectric layer includes the same material as the high-k dielectric layer. In an embodiment, the dummy fins have an outer width measured between outer surfaces of sidewalls of the dummy fins, the dummy fins have an inner width measured between sidewalls of the inner portions of the dummy fins, and the ratio of the inner width to the outer width is between about 1:50 to about 20:1. In an embodiment, the dummy fins have a first height measured between a surface level with a top surface of the STI regions and a top surface of the dummy fins, the STI regions have a first thickness measured between a bottom surface of the dummy fins and a bottom surface of the STI regions, and a ratio of the first thickness to the first height is between about 1:2 to about 40:1. In an embodiment, the semiconductor fins have a fin height measured between a top surface of the semiconductor fins and a top surface of the substrate and a fin pitch measured between opposite sidewalls of the of the semiconductor fins, and a ratio of the fin height to the fin pitch may be between about 5:1 to about 25:1.

In accordance with yet another embodiment, a device includes: a plurality of semiconductor fins extending from a substrate; a plurality of dummy fins, each dummy fin of the plurality of dummy fins being disposed between a respective pair of adjacent semiconductor fins of the plurality of semiconductor fins, wherein each dummy fin includes a respective inner portion and a respective outer portion encapsulating the respective inner portion, wherein each respective inner portion includes $SiO_2$, and wherein each respective outer portion includes a high-k dielectric material; and a plurality of shallow trench isolation (STI) regions on the substrate, each dummy fin of the plurality of dummy fins being over a corresponding STI region of the plurality of STI regions.

In accordance with yet another embodiment, a semiconductor device includes: a semiconductor substrate; a shallow trench isolation (STI) region on the semiconductor substrate; a first semiconductor fin extending from the semiconductor substrate, the first semiconductor fin being on a first side of the STI region; a second semiconductor fin extending from the semiconductor substrate, the second semiconductor fin being on a second side of the STI region, the second side being opposite the first side; and a dummy fin on the STI region, the dummy fin being interposed between the first semiconductor fin and the second semiconductor fin. The dummy fin includes: an inner portion, the inner portion being a first dielectric material; and an outer portion, the inner portion being interposed between a first sub-portion of the outer portion and a second sub-portion of the outer portion, the outer portion being a second dielectric material, the second dielectric material being different from the first dielectric material.

In accordance with yet another embodiment, a semiconductor device includes: a first semiconductor fin extending from a semiconductor substrate; a first source/drain region on the first semiconductor fin; a first shallow trench isolation (STI) region on the semiconductor substrate, the first STI region being on a first side of the first semiconductor fin; a second STI region on the semiconductor substrate, the second STI region being on a second side of the first semiconductor fin, the second side being opposite the first side; a first dummy fin extending from the first STI region, the first dummy fin including a first dielectric material encapsulated by a second dielectric material, the second dielectric material being different from the first dielectric material; and a second dummy fin extending from the second STI region, the second dummy fin including the first dielectric material encapsulated by the second dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a first semiconductor fin and a second semiconductor fin extending from a semiconductor substrate;

a first shallow trench isolation (STI) region on the semiconductor substrate, the first STI region being on a first side of the first semiconductor fin;

a second STI region on the semiconductor substrate, the second STI region being on a second side of the first semiconductor fin, the second side being opposite the first side; and a first dielectric structure extending from the first STI region, the first dielectric structure comprising a first dielectric material having a first material composition, and being encapsulated by a second dielectric material, the second dielectric material having a second material composition different from the first material composition of the first dielectric material.

2. The semiconductor device of claim 1, further comprising a second dielectric structure extending from the second STI region, and a first spacer interposed between the first dielectric structure and the first semiconductor fin and a second spacer interposed between the second dielectric structure and the first semiconductor fin.

3. The semiconductor device of claim 2, wherein the first spacer covers an upper surface of the first STI region and the second spacer covers an upper surface of the second STI region.

4. The semiconductor device of claim 1, further comprising a second semiconductor fin extending from the semiconductor substrate, the first dielectric structure dummy fin being interposed between the first semiconductor fin and the second semiconductor fin.

5. The semiconductor device of claim 1, wherein the first dielectric material is $SiO_2$.

6. The semiconductor device of claim 1, wherein the second dielectric material comprises $HfO_2$.

7. The semiconductor device of claim 1, wherein the second dielectric material has a higher dielectric constant than the first dielectric material.

8. The semiconductor device of claim 1, wherein a topmost surface of the first semiconductor fin is a first distance from a major surface of the semiconductor substrate, and further wherein a topmost surface of the first dielectric structure is the first distance from the major surface of the semiconductor substrate.

9. The semiconductor device of claim 1, further comprising:

a first source/drain region extending from the first semiconductor fin;

a second source/drain region extending from the second semiconductor fin; and wherein the first dielectric structure is interjacent and separates the first source/drain region and the second source/drain region.

10. The semiconductor device of claim 1, further comprising:

a first source/drain region extending from the first semiconductor fin;

a second source/drain region extending from the second semiconductor fin, wherein the first source/drain region and the second source/drain region merge at an interface; and wherein the first dielectric structure is vertically aligned with and below the interface.

11. The semiconductor device of claim 1, further comprising a channel region within the first semiconductor fin, the channel region extending a first distance from a major surface of the semiconductor substrate, and wherein the first dielectric structure extends a second distance from the major surface of the semiconductor substrate, the second distance being at least as great as the first distance.

12. The semiconductor device of claim 1, wherein the shallow trench isolation region has a first thickness below the first dielectric structure, the second dielectric material has a second thickness at a bottom of the first dielectric structure, and wherein a ratio of the second thickness to the first thickness is in a range of from 1:20 to 3:1.

13. A semiconductor device, comprising:

a first semiconductor protrusion and a second semiconductor protrusion extending from a top surface of a semiconductor substrate;

a first isolation material on the semiconductor substrate, the first isolation material being on a first side of the first semiconductor protrusion;

a second isolation material on the semiconductor substrate, the second isolation material being on a second side of the first semiconductor protrusion, the second side being opposite the first side; and a dielectric structure extending from a top surfaced of the first isolation material, the dielectric structure comprising a first dielectric material encapsulated by a second dielectric material, the second dielectric material being a different dielectric material than the first dielectric material, wherein a topmost surface of the dielectric structure is coplanar with a topmost surface of the first semiconductor protrusion; and a gate electrode extending over the first semiconductor protrusion and over the dielectric structure, the gate electrode extending between respective sidewalls of the first semiconductor protrusion and the dielectric structure.

14. The semiconductor device of claim 13, further comprising: a gate dielectric layer extending over a top surface and sidewalls of the first semiconductor protrusion and over a top surface and sidewalls of the dielectric structure.

15. The semiconductor device of claim 13, wherein the first dielectric material is $SiO_2$.

16. The semiconductor device of claim 13, wherein the second dielectric material comprises $HfO_2$.

17. A semiconductor device, comprising:

a first semiconductor fin and a second semiconductor fin extending from a semiconductor substrate;

a first shallow trench isolation (STI) region on the semiconductor substrate, the first STI region being on a first side of the first semiconductor fin, the first semiconductor fin extending above a topmost surface of the first STI region;

a second STI region on the semiconductor substrate, the second STI region being on a second side of the first semiconductor fin, the second side being opposite the first side; and a dielectric structure extending from the first STI region, the dielectric structure comprising a first dielectric material encapsulated on all sides by a second dielectric material, wherein the first dielectric material comprises a silicon oxide having a first dielectric constant, and wherein the second dielectric material comprises a high-k dielectric material having a dielectric constant greater than the first dielectric constant.

18. The semiconductor device of claim 17, further comprising:

a first source/drain region extending from the first semiconductor fin;

a second source/drain region extending from the second semiconductor fin; and wherein the dielectric structure is interjacent and separates the first source/drain region and the second source/drain region.

19. The semiconductor device of claim 17, further comprising:

a first source/drain region extending from the first semiconductor fin;

a second source/drain region extending from the second semiconductor fin, wherein the first source/drain region and the second source/drain region merge at an interface; and wherein the dielectric structure is vertically aligned with and below the interface.

20. The semiconductor device of claim 17, further comprising a channel region within the first semiconductor fin, the channel region extending a first distance from a major surface of the semiconductor substrate, and wherein the dielectric structure extends a second distance from the major surface of the semiconductor substrate, the second distance being at least as great as the first distance.

* * * * *